(12) United States Patent
Yatsuda et al.

(10) Patent No.: US 10,910,259 B2
(45) Date of Patent: Feb. 2, 2021

(54) SEMICONDUCTOR DEVICE MANUFACTURING METHOD

(71) Applicants: TOKYO ELECTRON LIMITED, Tokyo (JP); IMEC VZW, Leuven (BE)

(72) Inventors: Koichi Yatsuda, Tokyo (JP); Tatsuya Yamaguchi, Nirasaki (JP); Yannick Feurprier, Nijmegen (NL); Frederic Lazzarino, Leuven (BE); Jean-Francois de Marneffe, Leuven (BE); Khashayar Babaei Gavan, Leuven (BE)

(73) Assignees: TOKYO ELECTRON LIMITED, Tokyo (JP); IMEC VZW, Leuven (BE)

( * ) Notice: Subject to any disclaimer, the term of this patent is extended or adjusted under 35 U.S.C. 154(b) by 53 days.

(21) Appl. No.: 16/213,119

(22) Filed: Dec. 7, 2018

(65) Prior Publication Data
US 2019/0181039 A1 Jun. 13, 2019

(30) Foreign Application Priority Data
Dec. 13, 2017 (JP) ................................. 2017-239021

(51) Int. Cl.
*H01L 21/768* (2006.01)
*H01L 21/311* (2006.01)
*H01L 21/3105* (2006.01)

(52) U.S. Cl.
CPC .... *H01L 21/76814* (2013.01); *H01L 21/3105* (2013.01); *H01L 21/31116* (2013.01);
(Continued)

(58) Field of Classification Search
CPC ......... H01L 21/76814; H01L 21/76808; H01L 21/76811; H01L 21/76826;
(Continued)

(56) References Cited

U.S. PATENT DOCUMENTS 8,877,659 B2 * 11/2014 Chan ................. H01L 21/76825
438/798
9,058,983 B2 * 6/2015 Dubois ............. H01L 21/76826
(Continued)

OTHER PUBLICATIONS

Zhang, et al., PESM2014, Grenoble (France) "Low damage integration of ultralow-k porousorganosilicate glasses by Pore-Stuffing approach", p. 11.

*Primary Examiner* — Bac H Au
(74) *Attorney, Agent, or Firm* — Nath, Goldberg & Meyer; Jerald L. Meyer

(57) ABSTRACT

A semiconductor device manufacturing method of forming a trench and a via in a porous low dielectric constant film formed on a substrate as an interlayer insulating film, includes: embedding a polymer having a urea bond in pores of the porous low dielectric constant film by supplying a raw material for polymerization to the porous low dielectric constant film; forming the via by etching the porous low dielectric constant film; subsequently, embedding a protective filling material made of an organic substance in the via; subsequently, forming the trench by etching the porous low dielectric constant film; subsequently, removing the protective filling material; and after the forming a trench, removing the polymer from the pores of the porous low dielectric constant film by heating the substrate to depolymerize the polymer, wherein the embedding a polymer having a urea bond in pores is performed before the forming a trench.

8 Claims, 26 Drawing Sheets

(52) U.S. Cl.
CPC .. *H01L 21/31138* (2013.01); *H01L 21/31144* (2013.01); *H01L 21/76808* (2013.01); *H01L 21/76811* (2013.01); *H01L 21/76826* (2013.01); *H01L 21/76828* (2013.01); *H01L 21/76843* (2013.01)

(58) Field of Classification Search
CPC ......... H01L 21/76828; H01L 21/76843; H01L 21/76802; H01L 21/02321; H01L 21/02337; H01L 21/02359
See application file for complete search history.

(56) References Cited

U.S. PATENT DOCUMENTS

| | | | |
|---|---|---|---|
| 9,117,666 B2 * | 8/2015 | Le | H01L 21/76826 |
| 9,414,445 B2 | 8/2016 | Ahmad et al. | |
| 9,508,549 B2 * | 11/2016 | Park | H01L 21/02118 |
| 9,691,654 B1 * | 6/2017 | Singh | H01L 21/76813 |
| 9,941,151 B2 * | 4/2018 | Zhang | H01L 21/76814 |
| 10,147,640 B2 * | 12/2018 | Liu | H01L 21/76814 |
| 10,325,780 B2 * | 6/2019 | Yatsuda | H01L 21/02359 |
| 10,446,438 B2 * | 10/2019 | Yamaguchi | H01L 21/76834 |
| 2002/0074659 A1 * | 6/2002 | Dalton | H01L 21/76828 257/758 |
| 2006/0069171 A1 * | 3/2006 | Prokopowicz | H01L 21/3121 521/61 |
| 2012/0329273 A1 * | 12/2012 | Bruce | H01L 21/02203 438/653 |

\* cited by examiner

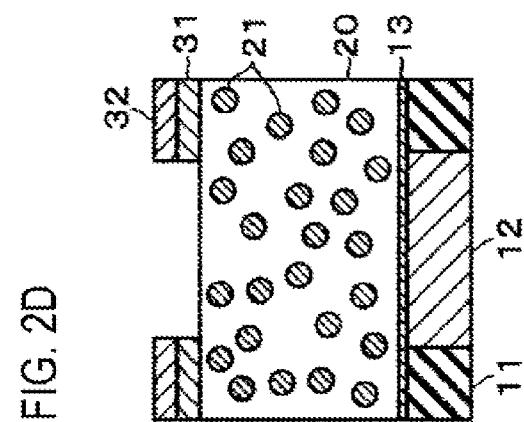
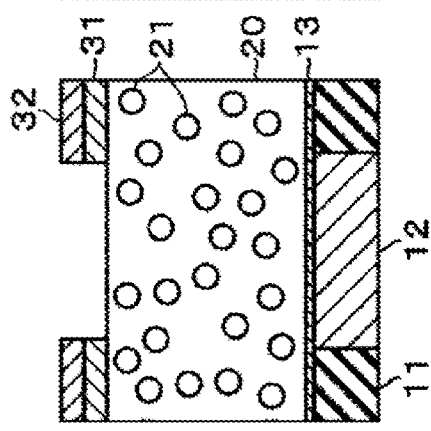
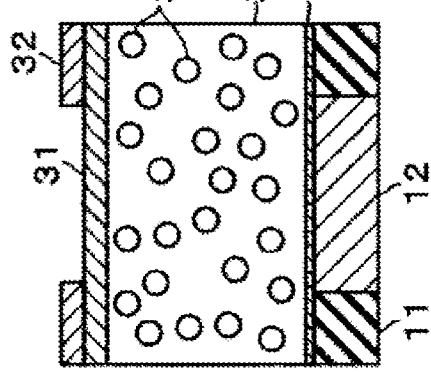
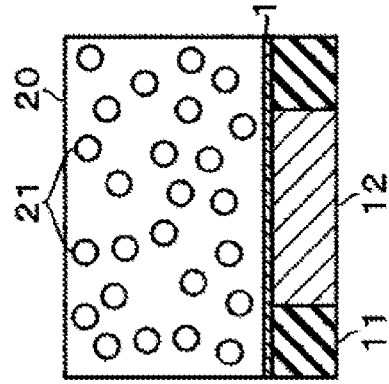

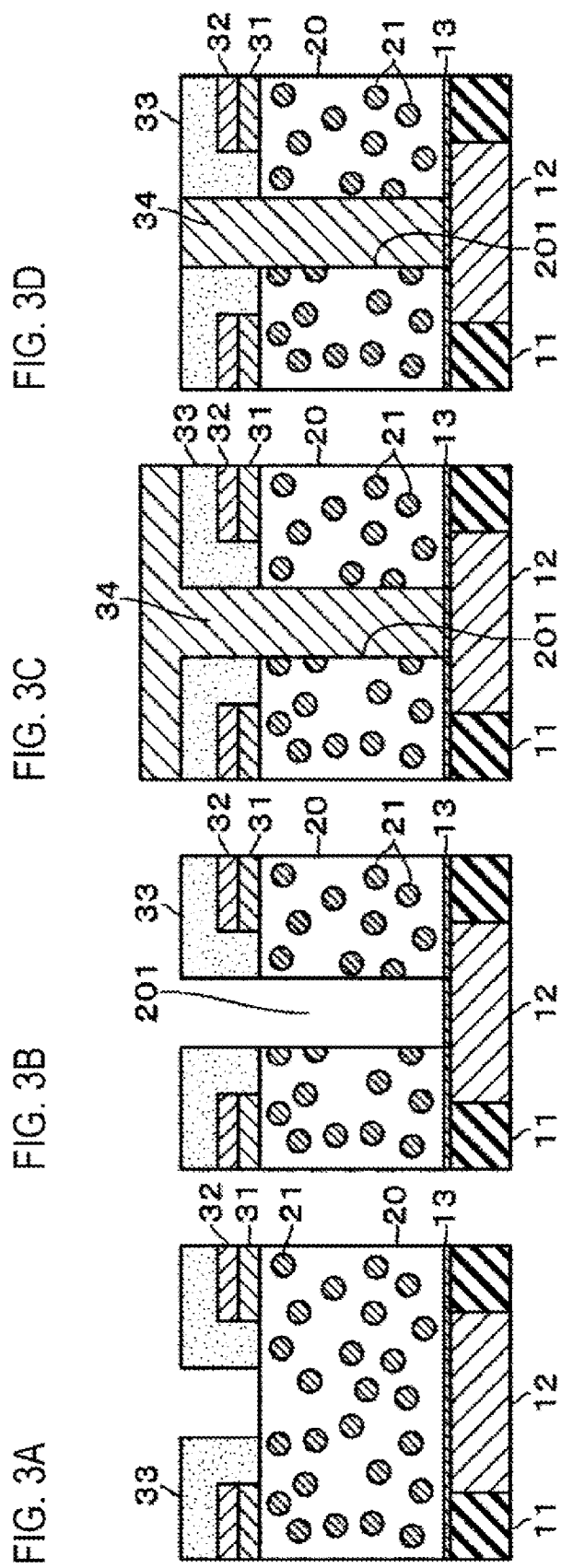

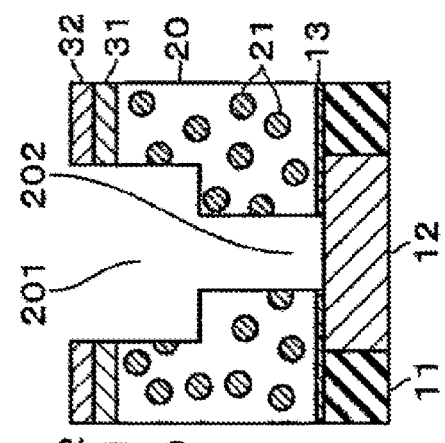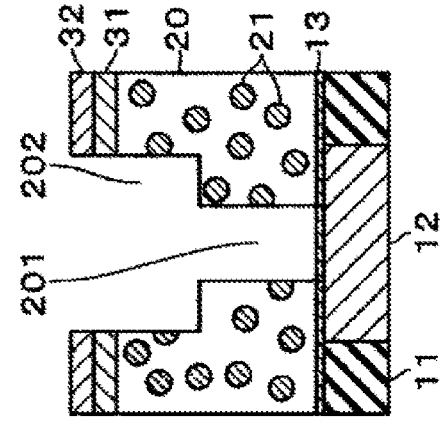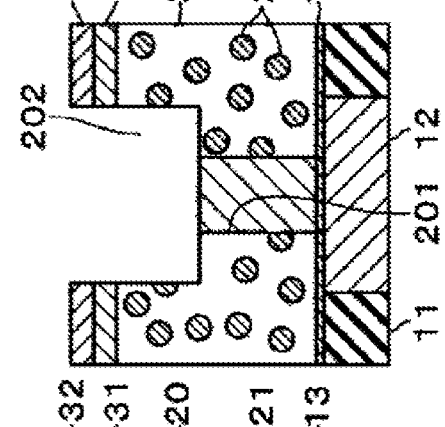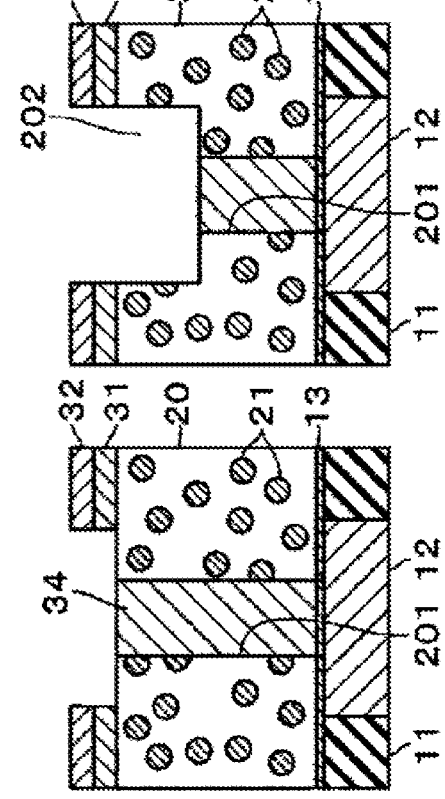

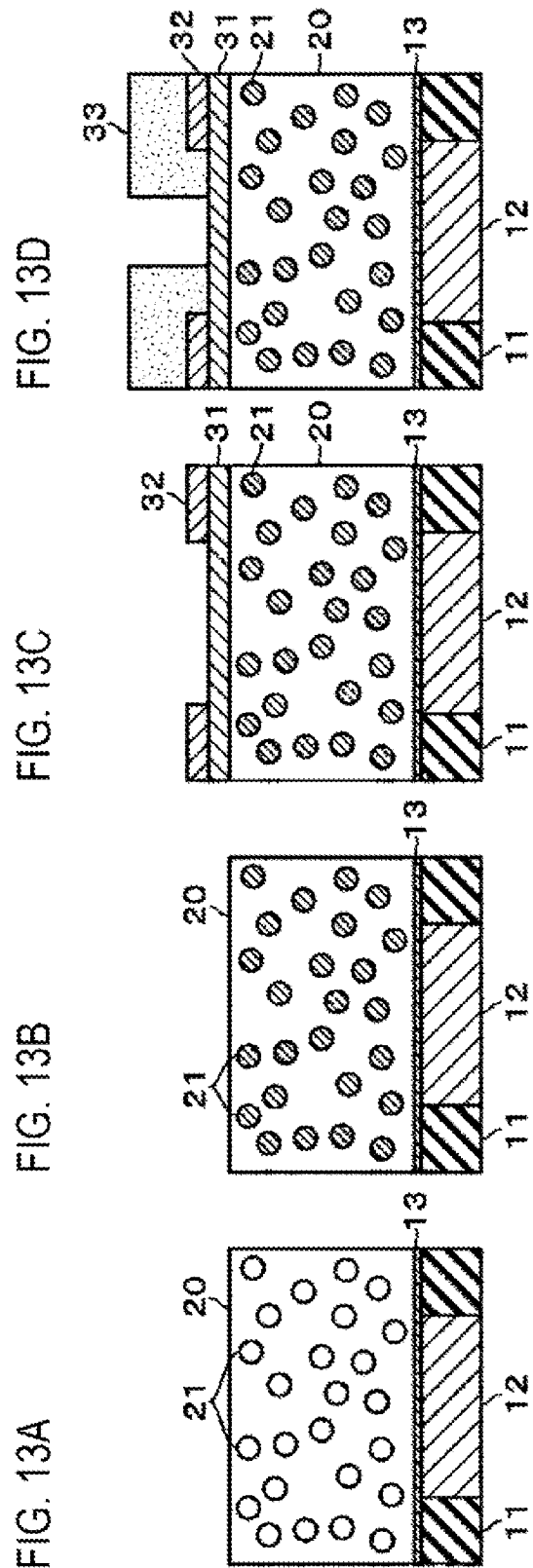

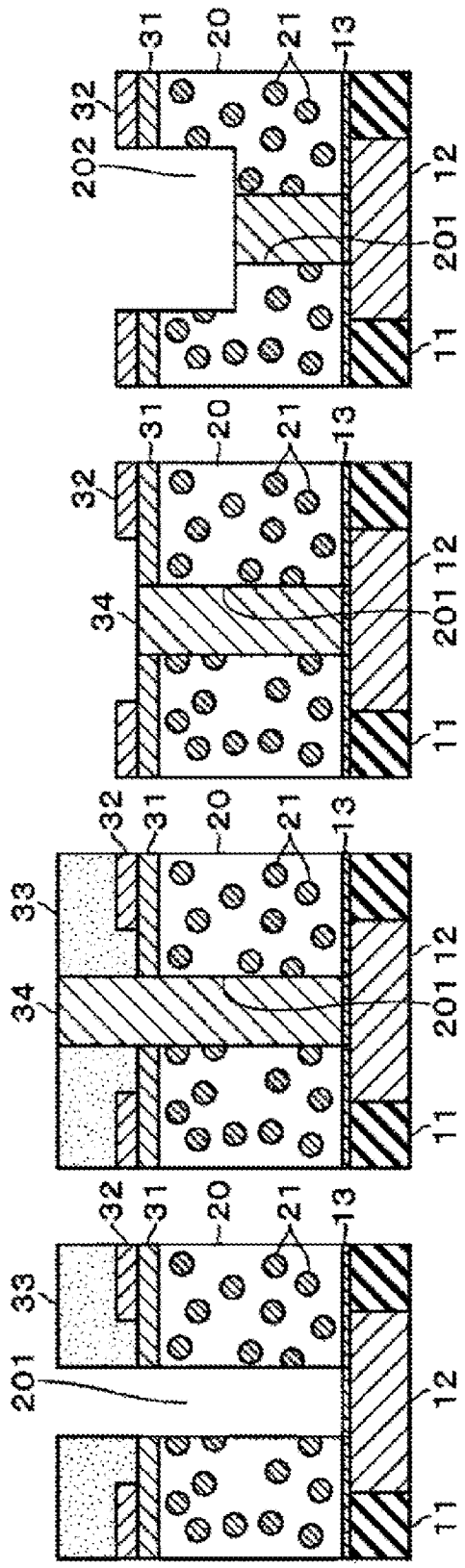

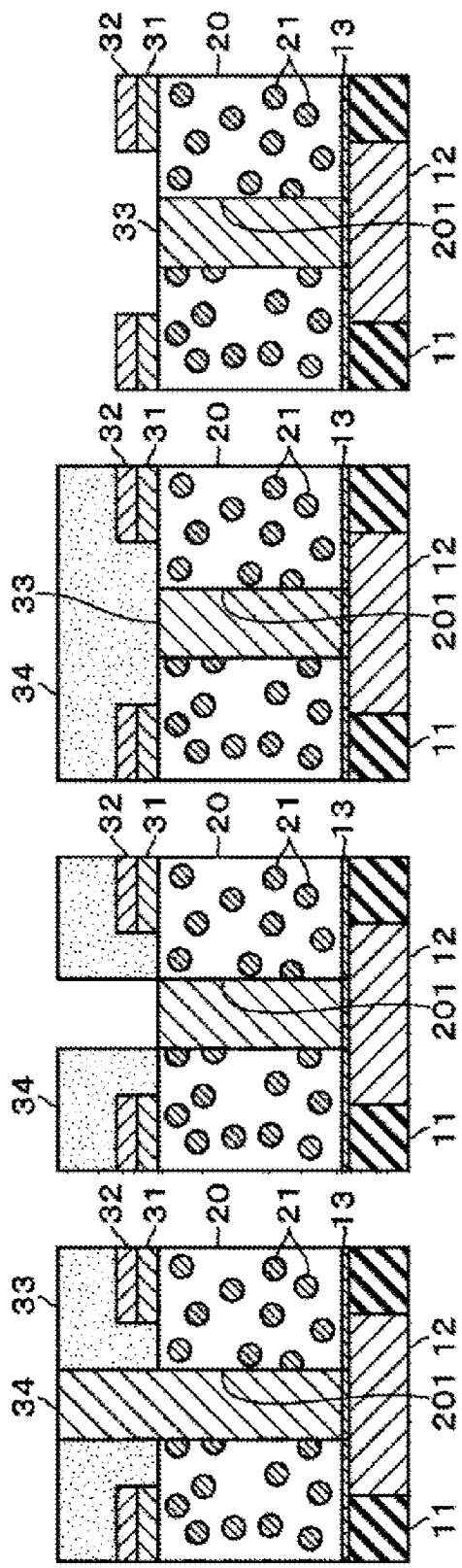

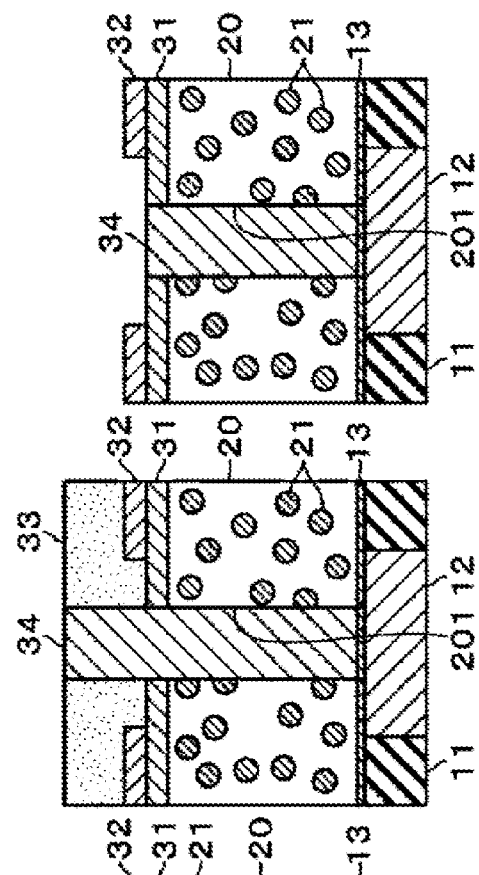

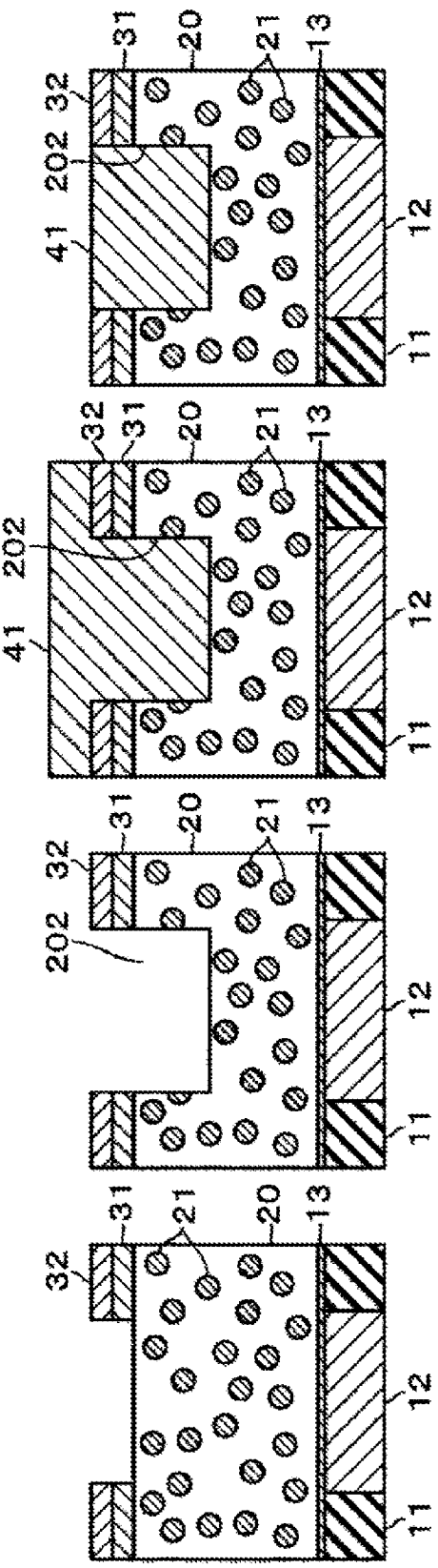

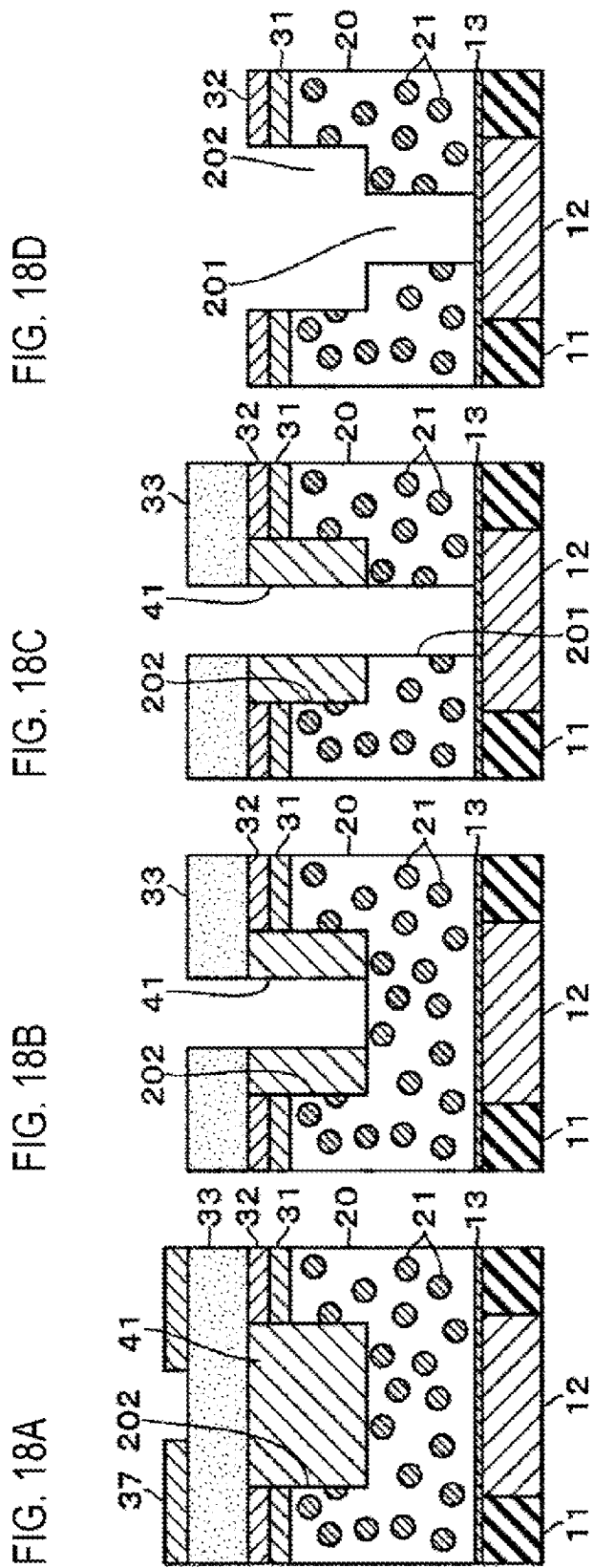

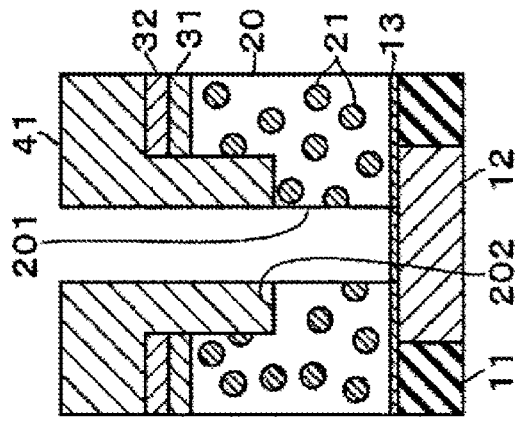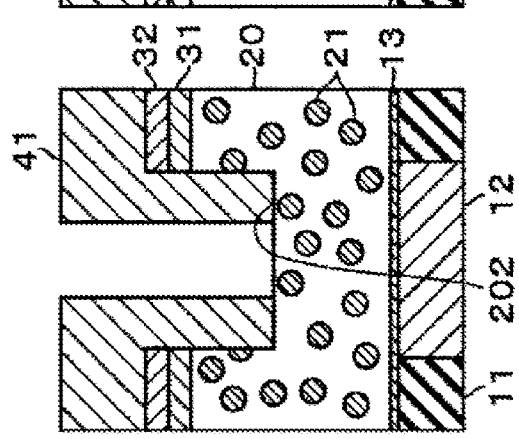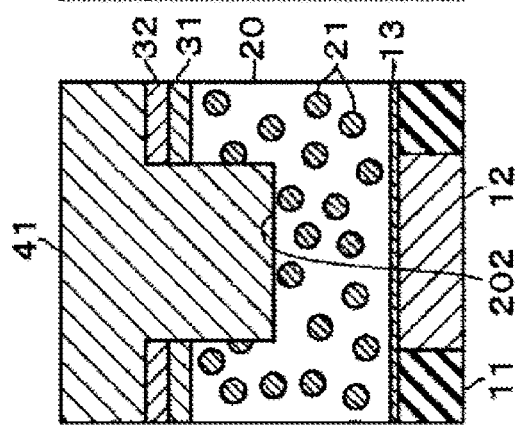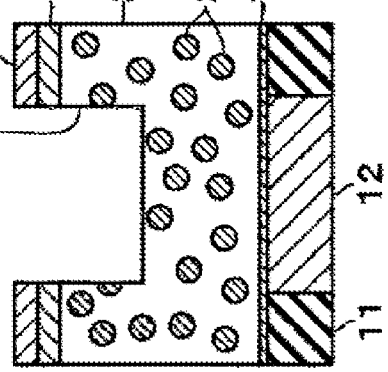

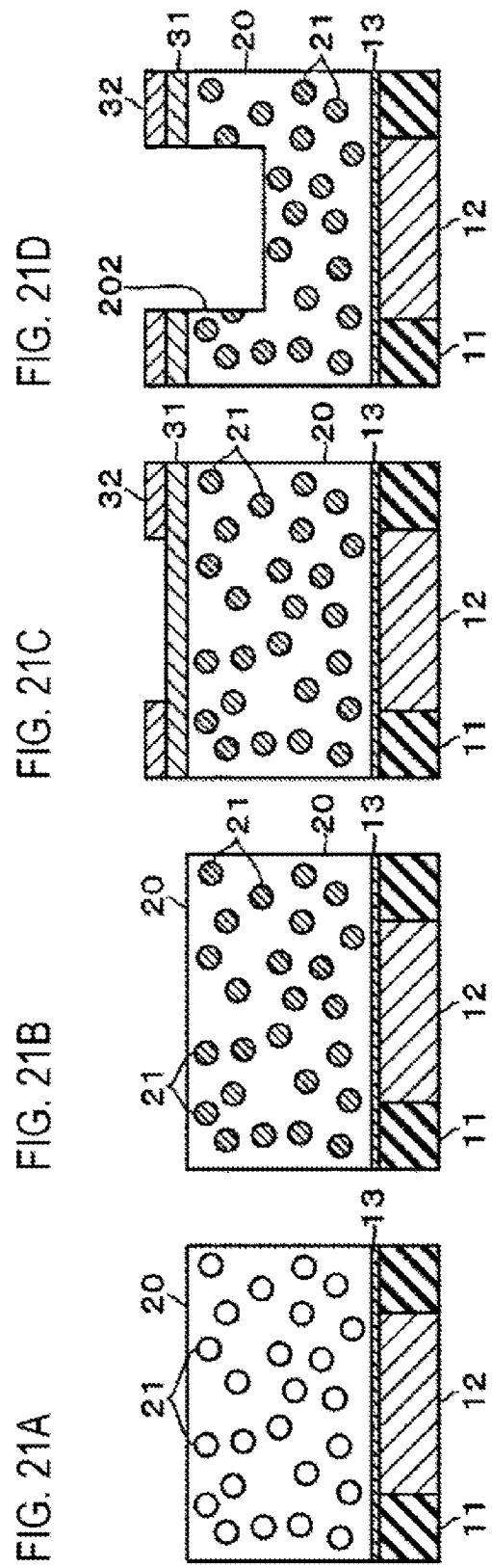

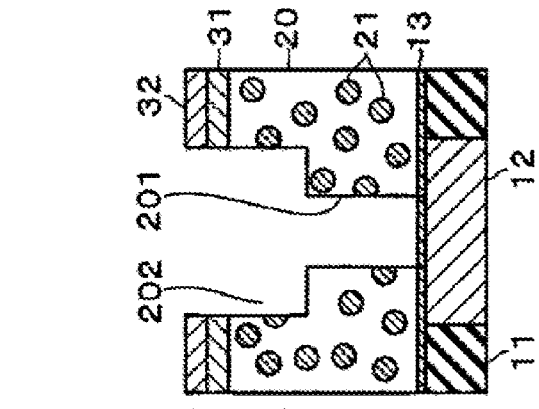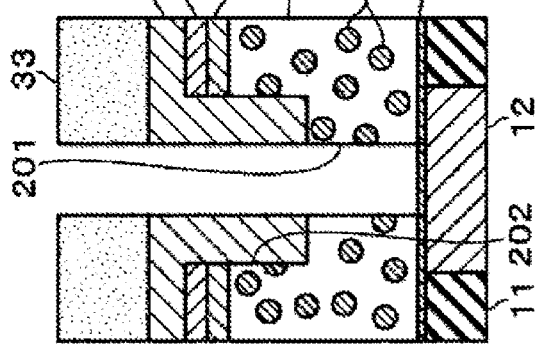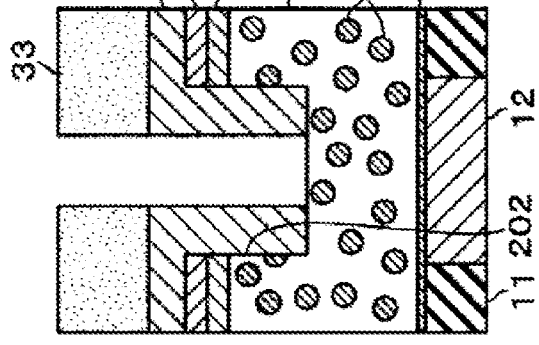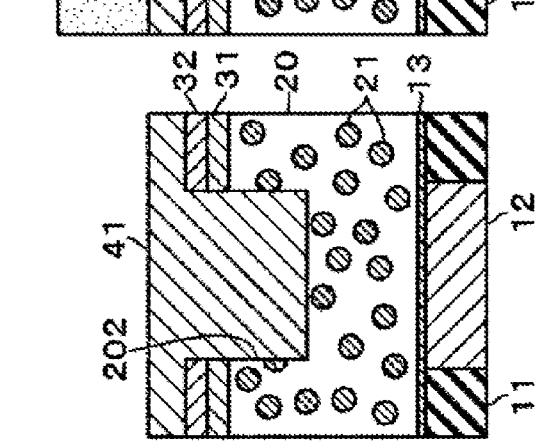

SEMICONDUCTOR DEVICE MANUFACTURING METHOD

CROSS-REFERENCE TO RELATED APPLICATION

This application claims the benefit of Japanese Patent Application No. 2017-239021, filed on Dec. 13, 2017, in the Japan Patent Office, the disclosure of which is incorporated herein in its entirety by reference.

TECHNICAL FIELD

The present disclosure relates to a technique for suppressing damage when a process of forming a via and a trench for embedding a wire is performed on a porous low dielectric constant film which is formed on a substrate for manufacturing a semiconductor device.

BACKGROUND

In the manufacturing process of a multilayered semiconductor device, a porous low dielectric constant film is used as a method for reducing the parasitic capacitance of an interlayer insulating film in order to improve an operation speed. This kind of film may include, for example, an SiOC film containing, for example, silicon, carbon, oxygen and hydrogen, and having Si—C bond. Etching is performed on the SiOC film by plasma of, for example, $CF_4$ gas as a CF-based gas, using a resist mask and an underlying mask in order to embed, for example, copper as a wiring material. Subsequently, ashing is performed on the resist mask by plasma of an oxygen gas.

Incidentally, when a plasma-based process such as etching or ashing is performed on the SiOC film, for example, the Si—C bond is cut by the plasma on an exposed surface of the SiOC film exposed to plasma, namely side walls and a bottom surface of a recess, so that C is desorbed from the film. Since Si having an unsaturated dangling bond produced by the desorption of C is unstable in that state, the Si is bonded with, for example, moisture in the atmosphere, to become Si—OH.

As described above, an etching gas or the like is diffused into a hole portion of the porous SiOC film by the plasma process, so that the SiOC film is damaged by the etching gas. Since the content of carbon is lowered in such a damaged layer, the dielectric constant is reduced. The miniaturization of the line width of a wiring pattern and thinning of a wiring layer, an insulating film, and the like have been progressed, which increases the influence of the surface portion of the SiOC film over a whole wafer. Thus, the reduction in the dielectric constant of the SiOC film may be one of the factors that cause the characteristics of a semiconductor device to deviate from a design value.

For example, there has been known a technology which includes embedding PMMA (acrylic resin) in advance in pores of a porous low dielectric constant film formed on a substrate, performing a process such as etching on the low dielectric constant film, heating the substrate, supplying a solvent, supplying microwaves, and removing the PMMA. However, in order to remove the PMMA, it is necessary to spend as much time as about 20 minutes by plasma. In addition, since the substrate has to be heated to a temperature of 400 degrees C. or more, there is a high possibility of adversely affecting an element portion already formed on the substrate.

In a concept of thermal decomposition of a resin, as the removal temperature of the resin decreases, the heat resistant temperature of the resin also decreases. In this concept, it is disclosed that only PMMA can be thermally unstuffed at 400 degrees C., which is an allowable temperature in a wiring process, but the thermal stability of PMMA drops to 250 degrees C. This means that a temperature of 250 degrees C. or higher is applied to PMMA during the protection process by PMMA, which deteriorates the PMMA film. Thus, the PMMA cannot be used as a protective film.

Therefore, in the prior art, even when a thermal process is performed in the state where the removal temperature of the protective film exceeds the allowable temperature, the PMMA film does not function as a protective film.

SUMMARY

Some embodiments of the present disclosure provide a technique capable of suppressing damage of an interlayer insulating film when forming a wiring recess in the interlayer insulating film, which is a porous low dielectric constant layer, in manufacturing a semiconductor device.

According to one embodiment of the present disclosure, there is provided a semiconductor device manufacturing method of forming a trench and a via in a porous low dielectric constant film formed on a substrate as an interlayer insulating film, the method including: embedding a polymer having a urea bond in pores of the porous low dielectric constant film by supplying a raw material for polymerization to the porous low dielectric constant film; forming the via by etching the porous low dielectric constant film; subsequently, embedding a protective filling material made of an organic substance in the via; subsequently, forming the trench by etching the porous low dielectric constant film; subsequently, removing the protective filling material; and after the forming a trench, removing the polymer from the pores of the porous low dielectric constant film by heating the substrate to depolymerize the polymer, wherein the embedding a polymer having a urea bond in pores is performed before the forming a trench.

According to another embodiment of the present disclosure, there is provided a semiconductor device manufacturing method of forming a trench and a via in a porous low dielectric constant film formed on a substrate as an interlayer insulating film, the method including: embedding a polymer having a urea bond in pores of the porous low dielectric constant film by supplying a raw material for polymerization to the porous low dielectric constant film; forming a trench mask on a surface of the porous low dielectric constant film; forming the trench by etching the porous low dielectric constant film using the trench mask; subsequently, forming a via mask in the trench; subsequently, forming the via by etching a bottom of the trench using the via mask; subsequently, removing the via mask; and after the forming a trench, removing the polymer from the pores of the porous low dielectric constant film by heating the substrate to depolymerize the polymer.

BRIEF DESCRIPTION OF THE DRAWINGS

The accompanying drawings, which are incorporated in and constitute some steps of the specification, illustrate embodiments of the present disclosure, and together with the general description given above and the detailed description of the embodiments given below, serve to explain the principles of the present disclosure.

FIGS. 2A to 2D are explanatory views illustrating some steps of a manufacturing process according to a first embodiment of the present disclosure.

FIGS. 3A to 3D are explanatory views illustrating some steps of the manufacturing process according to the first embodiment of the present disclosure.

FIGS. 4A to 4D are explanatory views illustrating some steps of the manufacturing process according to the first embodiment of the present disclosure.

FIGS. 13A to 13D are explanatory views illustrating some steps of a manufacturing process according to a modification of the first embodiment.

FIGS. 14A to 14D are explanatory views illustrating some steps of the manufacturing process according to the modification of the first embodiment.

FIGS. 15A to 15D are explanatory views illustrating some steps of a manufacturing process according to a modification of the first embodiment.

FIGS. 16A to 16D are explanatory views illustrating some steps of a manufacturing process according to a modification of the first embodiment.

FIGS. 17A to 17D are explanatory views illustrating some steps of a manufacturing process according to a second embodiment of the present disclosure.

FIGS. 18A to 18D are explanatory views illustrating some steps of the manufacturing process according to the second embodiment of the present disclosure.

FIGS. 19A to 19D are explanatory views illustrating some steps of a manufacturing process according to a modification of the second embodiment.

FIGS. 21A to 21D are explanatory views illustrating some steps of the manufacturing process according to the modification of the second embodiment.

FIGS. 22A to 22D are explanatory views illustrating some steps of the manufacturing process according to the modification of the second embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Outline of Embodiment of Present Disclosure

In a case where a plurality of layers, on each of which an integrated circuit is formed, is stacked in a semiconductor device, it is necessary to form a via (a via hole), in which a wire for connecting an underlying circuit and an upper-lying circuit is embedded, and a trench (groove), in which a wire constituting a portion of the integrated circuit of each layer is embedded, in an interlayer insulating film.

In forming a via and a trench, there are a method of forming the via followed by the trench in an interlayer insulating film, and a method of forming the trench followed by the via the interlayer insulating film. Herein, the method of initially forming the via will be referred to as a "via-first method", and a method of initially forming the trench will be referred to as a "trench-first method".

Figure 1:
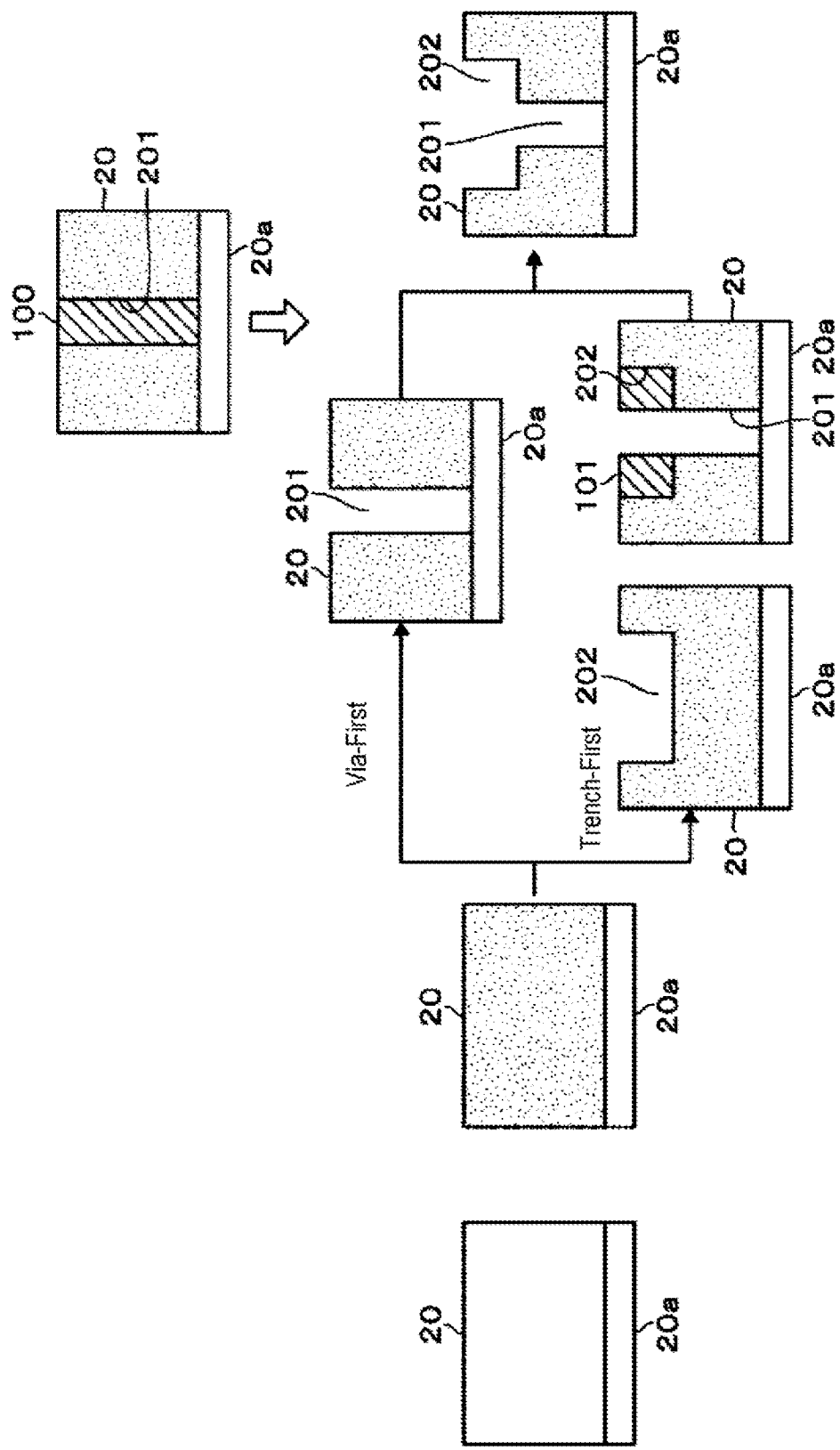
FIG. 1 is an explanatory view illustrating an outline of an embodiment of the present disclosure.

FIG. 1 is a view schematically showing an outline of an embodiment of the present disclosure, in which the via-first method and the trench-first method are illustrated. In the embodiment of the present disclosure, a porous low dielectric constant film 20 is used as an interlayer insulating film, and polyurea is embedded in pores formed in the low dielectric constant film 20. In the low dielectric constant film 20, the state in which polyurea is embedded in the pores is marked with dots. An underlying layer formed under the low dielectric constant film 20 is schematically indicated by reference numeral 20a.

In the via-first method which has been generally performed, a via 201 is formed and then a trench 202 is formed. In the embodiment of the present disclosure, after forming the via 201 and before forming the trench 202, a protective filling material 100 is embedded in the via 201, as an intermediate process indicated by an arrow. The via 201 indicates a hole extending downward of the bottom of the trench. For the sake of convenience in illustration herein, a hole portion defined above a via as a projection area to which the via is projected will also be referred to as a "via". This via is also indicated by reference numeral 201.

In the trench-first method, a trench 202 is formed and then a via-formation etching mask 101 is formed in the trench 202. Subsequently, the bottom of the low dielectric constant film 20 is etched with the mask 101 to form the via 201. Thereafter, the mask 101 in the trench 202 is removed by etching or ashing.

First Embodiment

A first embodiment of the present disclosure is a method applied to the via-first method. FIGS. 2A to 5C are explanatory views illustrating stepwise how to form an upper-lying circuit portion on an underlying circuit portion. Reference numeral 11 indicates, for example, an underlying interlayer insulating film. Reference numeral 12 indicates a copper wire as a wiring material embedded in the underlying interlayer insulating film 11, and reference numeral 13 indicates an etching stopper film having the function of a stopper at the time of etching. The etching stopper film 13 is formed of, for example, silicon carbide (SiC) or silicon carbide nitride (SiCN).

The low dielectric constant film 20 as an interlayer insulating film is formed on the etching stopper film 13. In this embodiment, an SiOC film is used for the low dielectric constant film 20. The SiOC film is formed by a CVD method by, for example, plasmarizing DEMS (diethoxymethylsilane). The low dielectric constant film 20 is porous. In the figures, pores 21 formed in the low dielectric constant film 20 are shown with emphasis. An SiOC film is also used for the underlying interlayer insulating film 11.

In the method of the present embodiment, processing is initiated from the state in which the underlying circuit portion is formed on a surface of a semiconductor wafer (hereinafter referred to as a "wafer") as a substrate, and the low dielectric constant film 20 is formed on the underlying circuit portion, as illustrated in FIG. 2A.

Subsequently, as illustrated in FIG. 2B, a silicon oxide film 31 is formed on the low dielectric constant film 20 by CVD (chemical vapor deposition), for example, at a process temperature of 300 degrees C. in a vacuum atmosphere. The silicon oxide film 31 is produced by, for example, the reaction of vapor of an organic silicon source material with an oxidizing gas such as oxygen or ozone. The silicon oxide film 31 plays a role of a portion of a pattern mask (hard mask) during etching described later, and also plays a role of protecting the low dielectric constant film 20 at the time of etching a hard mask 32 to be described later. Subsequently, as illustrated in FIG. 2B, the hard mask 32, which is a pattern mask for etching and is made of, for example, a titanium nitride (TiN) film, is formed by a known method. The hard mask 32 is formed so that a portion corresponding to a trench is opened.

Thereafter, the silicon oxide film 31 is etched by, for example, a gas obtained by activating (plasmarizing) $CH_3F$ gas (FIG. 2C). The pores 21 in the low dielectric constant film 20 are embedded with a polymer having a urea bond (polyurea), which is a filling material (FIG. 2D). In FIG. 2D, the state in which the pores 21 are embedded with polyurea is indicated by hatching for the sake of convenience in illustration. The polyurea embedded in the pores 21 in the low dielectric constant film 20 plays a role of protecting the low dielectric constant film 20 as a protective film from plasma generated in a plasma process (to be described later).

Figure 6:
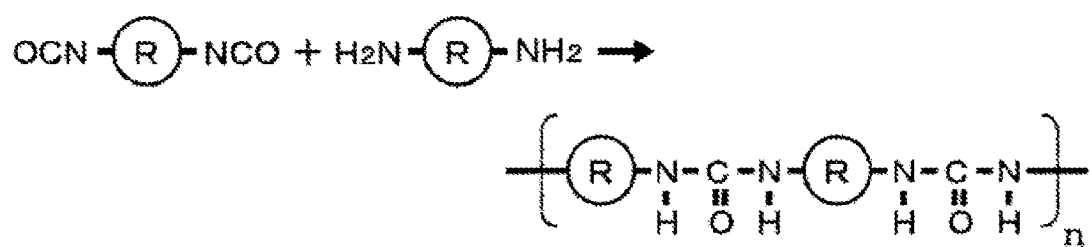
FIG. 6 is an explanatory view illustrating how a polymer having a urea bond is produced by a copolymerization-based reaction.

For example, the polyurea film can be produced by copolymerization using an isocyanate and an amine as illustrated in FIG. 6. R is, for example, an alkyl group (a linear alkyl group or a cyclic alkyl group) or an aryl group, and n is an integer of 2 or more.

Figure 7A:
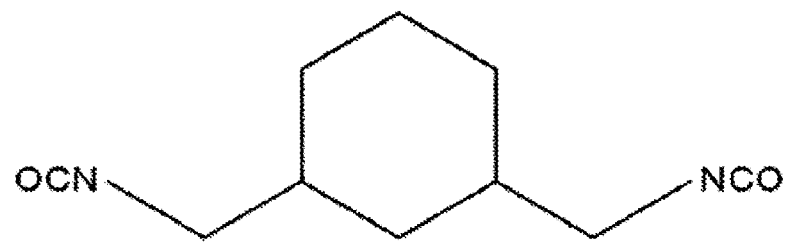
FIGS. 7A and 7B are views illustrating exemplary molecular structures of isocyanate.
Figure 7B:
Figure 8A:
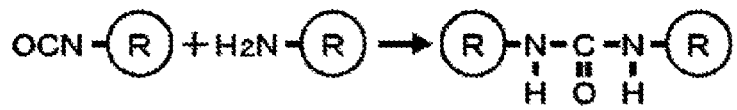
FIGS. 8A to 8D are explanatory views showing a reaction in which a polymer having a urea bond becomes an oligomer.
Figure 8B:
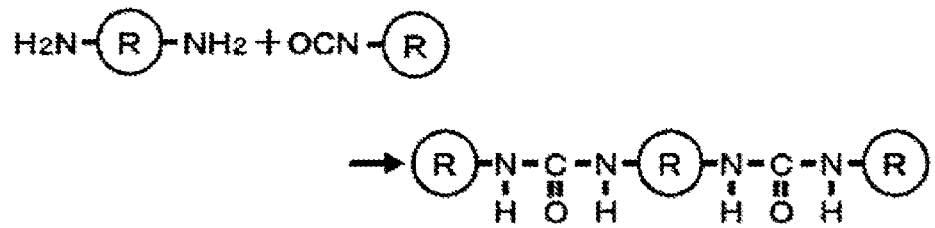
Figure 8C:
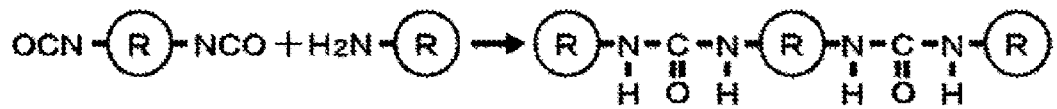
Figure 8D:
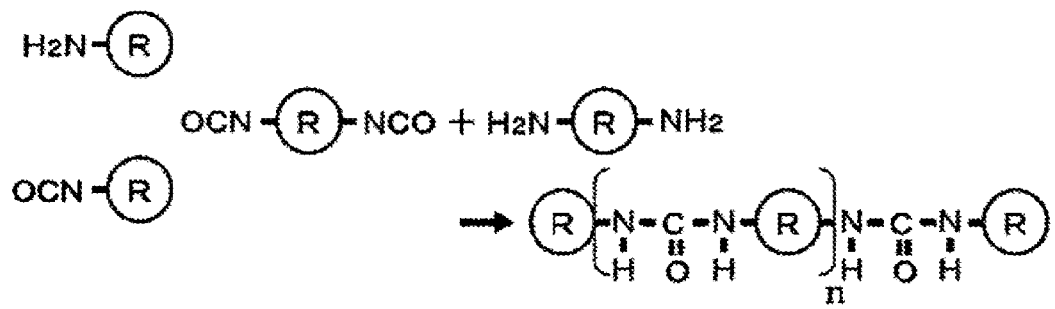

As the isocyanate, for example, an alicyclic compound, an aliphatic compound, an aromatic compound or the like may be used. As the alicyclic compound, for example, as illustrated in FIG. 7A, 1,3-bis (isocyanatomethyl) cyclohexane (H6XDI) may be used. As the aliphatic compound, for example, as illustrated in FIG. 7B, hexamethylene diisocyanate may be used. As the amine, for example, 1,3-bis (aminomethyl) cyclohexane (H6XDA) may be used.

Figure 11:
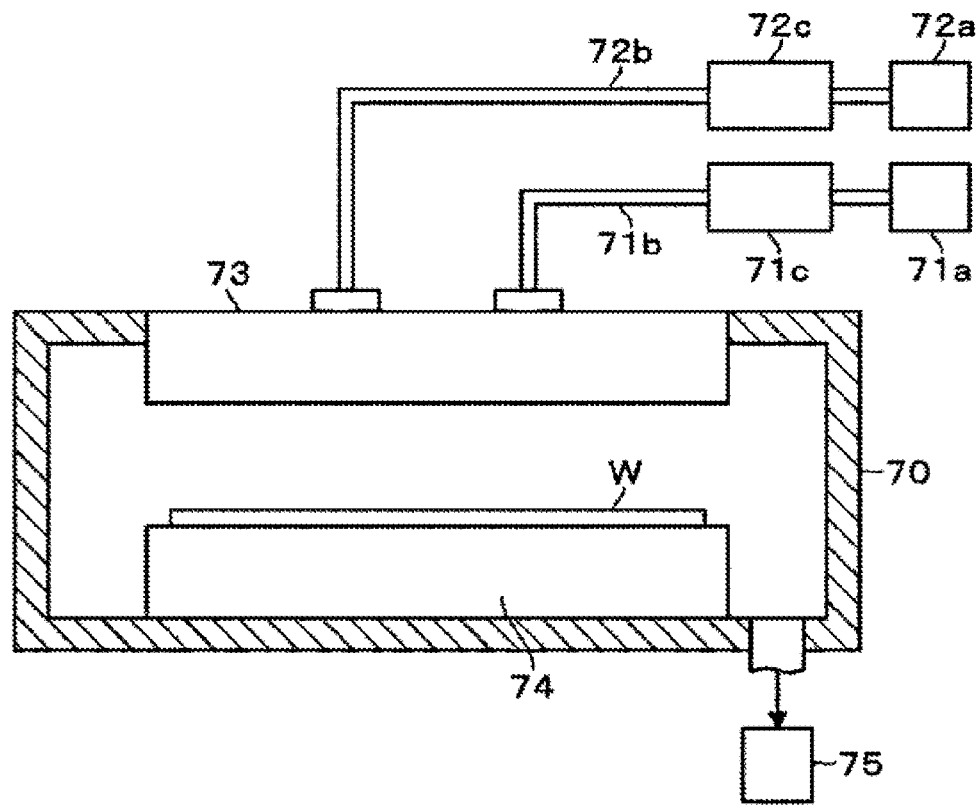
FIG. 11 is a cross-sectional view illustrating an apparatus for reacting each of an isocyanate and an amine with steam so as to produce a polymer having a urea bond.

A CVD apparatus for forming (vapor deposition polymerization) polyurea by reacting a raw material monomers with each other in a gaseous state is shown in FIG. 11. In FIG. 11, reference numeral 70 indicates a vacuum container, which defines a vacuum atmosphere. Reference numerals 71a and 72a indicate raw material supply sources which respectively accommodate isocyanate and amine as raw material monomers in a liquid state. The isocyanate liquid and the amine liquid are vaporized by vaporizers 71c and 72c respectively installed in supply pipes 71b and 72b. Isocyanate and amine staying in a vapor state by the vaporization are introduced into a shower head 73, which is a gas ejection part. The shower head 73 has a large number of ejection holes formed in the lower surface thereof and is configured to eject the isocyanate vapor and the amine vapor into a treatment atmosphere from the respective ejection holes. The semiconductor wafer W as a substrate whose surface is processed, is mounted on a mounting table 74 provided with a heating mechanism.

As a method of embedding polyurea in the pores 21 of the low dielectric constant film 20, it may be possible to adopt a method of alternately supplying isocyanate vapor and amine vapor to a semiconductor wafer W (hereinafter, simply referred to as "wafer W"), which includes the aforementioned circuit portion. In this case, it may be possible to use a method of stopping the supply of the isocyanate vapor, followed by purging the interior of the vacuum container 70 with a nitrogen gas, followed by supplying the amine vapor, followed by stopping the supply of the amine vapor, followed by purging the interior of the vacuum container 70 with the nitrogen gas, followed by starting the supply of the isocyanate vapor. Alternatively, it may be possible to use a method of stopping the supply of one of the isocyanate vapor and the amine vapor, followed by supplying the other vapor while bypassing the purging process, followed by stopping the supply of the other vapor, followed by supplying the one vapor while bypassing the purging process. In some embodiments, it may be possible to use a method of simultaneously supplying the isocyanate vapor and the amine vapor to the wafer W.

Of the aforementioned two methods that alternately supply the isocyanate vapor and the amine vapor, in the former method (i.e., the method which performs the purging process between the supply of one of the isocyanate vapor and the amine vapor and the supply of the other), polyurea is not deposited on the surface of the low dielectric constant film 20, but is embedded in the pores 21. In the latter method (the method which bypasses the purging process between the supply of one of the isocyanate vapor and the amine vapor and the supply of the other), polyurea is embedded in the pores 21, but is also deposited on the surface of the wafer W other than the low dielectric constant film 20 (on the hard mask 32). This phenomenon is described in an Evaluation test to be described later. It is considered that the phenomenon occurs when parameter values such as the number of supply cycles are selected. In the case of adopting the latter method, a state illustrated in FIG. 2D is obtained by heating the wafer W to a temperature at which the polyurea is depolymerized and removing the polyurea on the surface of the hard mask 32. In polyurea, a reversible equilibrium reaction between polymerization and depolymerization is established, and depolymerization is dominant as temperature rises. Therefore, when depolymerization occurs, produced monomers are vaporized with time. For example, at each temperature of 200 degrees C., 250 degrees C., and 300 degrees C., a period of time taken until polyurea disappears is the shortest at the temperature of 300 degrees C.

Therefore, by selecting the temperature and the period of time, it is possible to leave polyurea only in the low dielectric constant film 20.

In the method using the isocyanate vapor and the amine vapor, the temperature of the wafer W is set within a temperature range from room temperature to a temperature slightly lower than the temperature at which polyurea is depolymerized. For example, the polymerization reaction is promoted, for example, in a temperature range of 20 degrees C. to 200 degrees C.

Further, as illustrated in FIGS. 8A to 8D, monofunctional molecules may be used as raw material monomers.

Figure 9A:
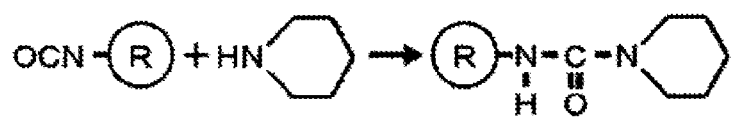
FIGS. 9A and 9B are explanatory views illustrating how a polymer having a urea bond is produced using a secondary amine.
Figure 9B:
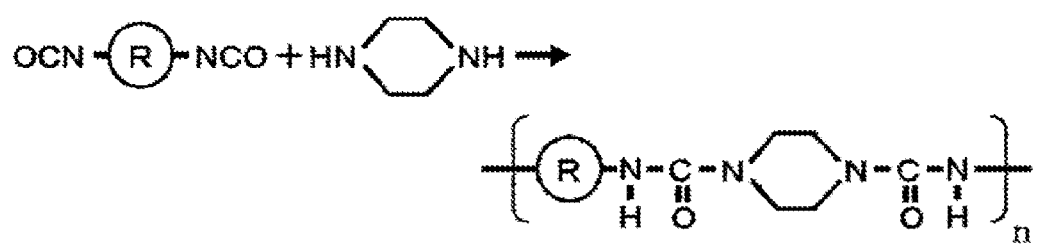

Furthermore, as illustrated in FIGS. 9A and 9B, an isocyanate and a secondary amine may be used. Bonds contained in the polymer produced in this case are urea bonds.

Figure 10:
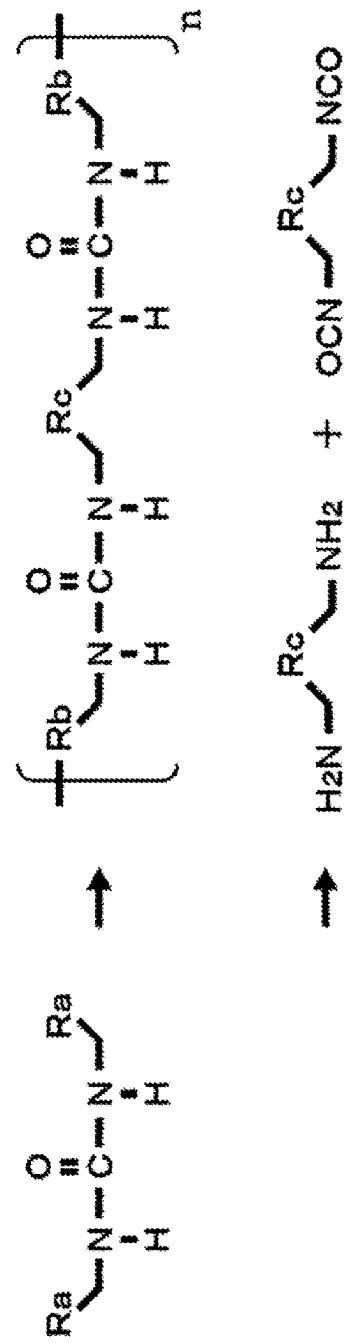
FIG. 10 is an explanatory view illustrating how a polymer having a urea bond is produced by crosslinking monomers having a urea bond.

In addition, a raw material monomer having a urea bond may be polymerized to obtain a polyurea film. FIG. 10 illustrates such an example. In this example, the raw material monomer is irradiated with light, for example, ultraviolet rays so that the raw material monomer is subjected to light energy, whereby a polyurea film is produced. In this case, the raw material monomer is subjected to light energy while being supplied to the wafer W.

After the polyurea is embedded in the pores 21 of the low dielectric constant film 20 in this way, a pattern mask for via 33 made of Spin-On-Carbon (SOC), in which a portion corresponding to the via 201 is opened (FIG. 3A). The low dielectric constant film 20 is etched to form the via 201 (FIG. 3B). The SOC is a coating film containing carbon as a main component, which is coated by spin coating. The SOC is formed as a pattern mask using a resist.

The method of etching the low dielectric constant film 20 (in this embodiment, an SiOC film) can be performed using plasma obtained by plasmarizing $C_6F_6$ gas. In this case, a trace amount of oxygen gas may be added.

Subsequently, a protective filling material 34 made of an organic substance (in this embodiment, polyurea) is embedded in the via 201. The process of embedding the protective filling material 34 (polyurea) is carried out by alternately supplying, for example, the isocyanate vapor and the amine vapor to the wafer having the circuit portion formed thereon in a vacuum atmosphere as described above. As a result, the polyurea is embedded in the via 201 so that the protective filling material 34 is formed. The polyurea is also deposited on a surface of the pattern mask 33 other than the via 201 (FIG. 3C). Thereafter, as described above, the wafer is heated to a temperature at which the polyurea is depolymerized so that the polyurea (polyurea film) deposited on the surface of the pattern mask 33 other than the via 201 is removed (FIG. 3D).

Subsequently, the pattern mask 33 made of SOC is removed by ashing (etching) with plasma obtained by plasmarizing, for example, an oxygen gas (FIG. 4A). At this time, the polyurea embedded in pores of the pattern mask 33 is also etched and removed by the plasma together with the SOC.

The low dielectric constant film 20 is etched using the silicon oxide film 31 and the hard mask 32 used as a mask for trench to form the trench 202 (FIG. 4B). The method of etching the low dielectric constant film 20 (in this embodiment, the SiOC film) can be performed using plasma obtained by plasmarizing a $C_6F_6$ gas. In this case, a trace amount of oxygen gas may be added. By such an etching, the protective filling material 34 formed of polyurea is also etched together with the low dielectric constant film 20. An etching rate of polyurea is slower than that of the low dielectric constant film 20. For this reason, when the low dielectric constant film 20 is etched to a predetermined depth, the protective filling material 34 slightly protrudes from the bottom of the trench 202. Thus, it is possible to remove the protruding protective filling material 34 by performing ashing with, for example, plasma obtained by plasmarizing an oxygen gas, thereby planarizing the trench 202.

Subsequently, when the wafer is heated to the temperature at which polyurea is depolymerized, for example 350 degrees C., the amine is depolymerized and evaporized. As a result, the protective filling material 34 made of polyurea is removed as illustrated in FIG. 4C. In heating the wafer, the wafer may be heated at a temperature lower than 400 degrees C., for example, 390 degrees C. or lower (e.g., 300 to 350 degrees C.) so as not to adversely affect an element portion already formed on the wafer, specifically a copper wire. A period of time during which polyurea is depolymerized, for example, a period of time during which the wafer is heated at 300 degrees C. to 400 degrees C. may be, for example, 5 minutes or less, from the viewpoint of suppressing thermal damage to the element.

Figure 12:
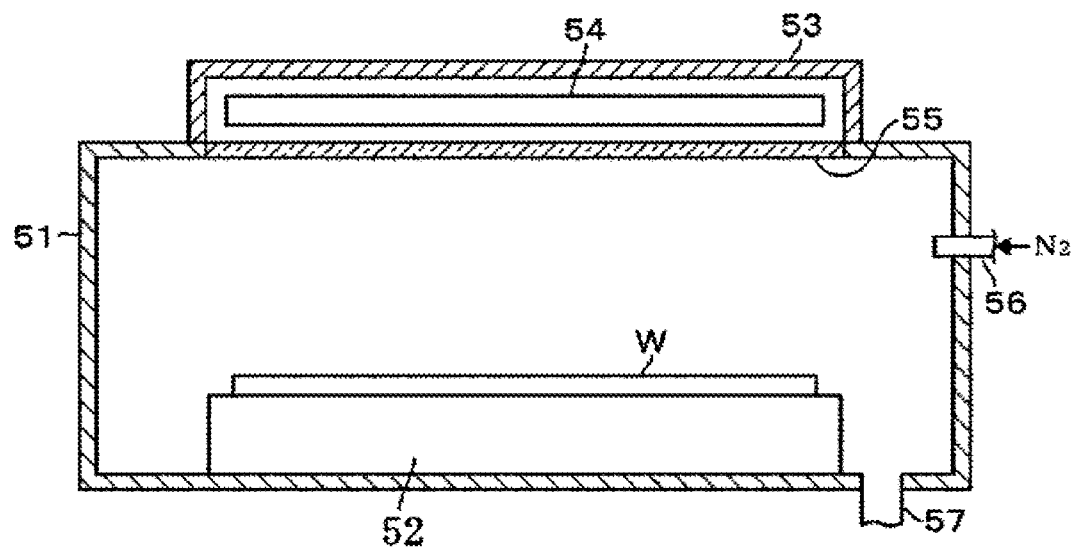
FIG. 12 is a cross-sectional view illustrating a heating device for heating a substrate on which a polyurea film is formed.

As illustrated in FIG. 12, for example, the processing of heating the wafer can be performed by mounting the wafer on a mounting table 52 inside a processing chamber 51 and heating the wafer with an infrared lamp 54 installed in a lamp house 53. In FIG. 12, reference numeral 55 indicates a transmission window, reference numeral 56 indicates a supply pipe that supplies a nitrogen gas, and reference numeral 57 indicates an exhaust pipe. The heating process may be performed in a vacuum atmosphere while supplying, for example, a nitrogen gas as an inert gas (in this case, a vacuum exhaust mechanism 75 is connected to the exhaust pipe 57 and a vacuum container is used as the processing container 51), or in a normal pressure atmosphere.

A heating mechanism of heating the wafer is not limited to the infrared lamp 54, and may be a heater provided on the mounting table 52.

After removing the protective filling material 34, the etching stopper film 13 existing on the bottom of the via 201 is etched and removed (FIG. 4D). In a case where the etching stopper film 13 is, for example, an SiC film, the etching can be performed by plasma obtained by plasmarizing, for example, a $CF_4$ gas.

Figure 5A:
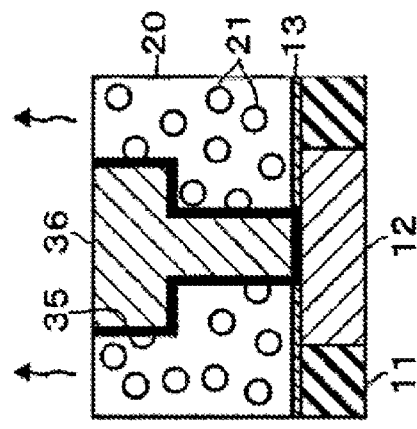
FIGS. 5A to 5C are explanatory views illustrating some steps of the manufacturing process according to the first embodiment of the present disclosure.
Figure 5B:
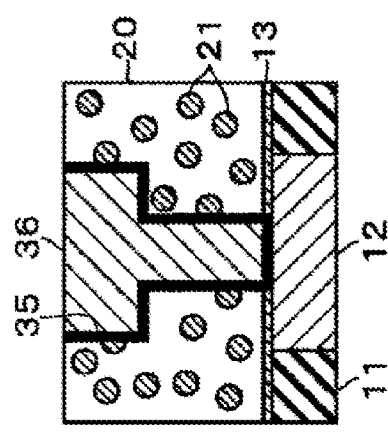
Figure 5C:
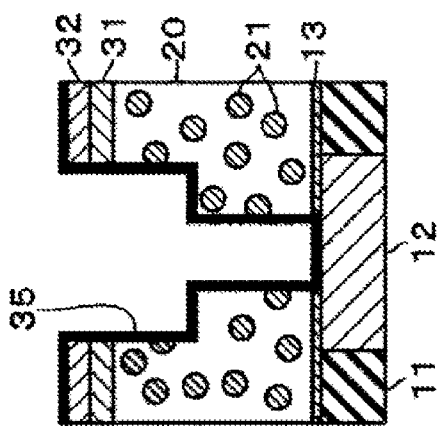

Thereafter, a barrier layer 35 for preventing copper used as a conductive path (to be described later) from diffusing into the low dielectric constant film 20 as an interlayer insulating film, is formed on inner surfaces of the via 201 and the trench 202 (FIG. 5A). For example, the barrier layer 35 is composed of a laminated film of Ti and TiON. Thereafter, a copper 36 is embedded in the via 201 and the trench 202. Excessive copper 36, the barrier layer 35, the silicon oxide film 31, and the hard mask 32 are removed by Chemical Mechanical Polishing (CMP), and a copper wire 36 (which is denoted by the same reference numeral as the copper) is formed (FIG. 5B). Subsequently, the wafer is heated to a temperature at which polyurea is depolymerized, for example, 350 degrees C., so as to remove the polyurea embedded in the pores 21 of the low dielectric constant film 20 (FIG. 5C), whereby an upper-lying circuit portion is formed.

The process of removing the polyurea embedded in the pores 21 of the low dielectric constant film 20 is not limited to this embodiment. As an example, the removing process may be performed after removing a portion of the etching stopper film 13 by etching (FIG. 4D) and before forming the barrier layer 35.

According to the first embodiment, a raw material for polymerization is supplied to the low dielectric constant film 20, a polyurea having a urea bond is embedded in the pores 21 of the low dielectric constant film 20, the low dielectric constant film 20 is etched and subsequently, the wafer is heated to depolymerize the polyurea. Therefore, when etching the low dielectric constant film 20, the low dielectric constant film 20 is protected by the polyurea (polymer). Since the via 201 is embedded with a filling material made of polyurea after the formation of the via 201 and before the formation of the trench 202, an inner circumferential surface of the via 201 is protected from the etching gas used when forming the trench 202. Therefore, since the low dielectric constant film is protected from the etching gas in addition to embedding the polymer in the pores 21, the occurrence of damage to the low dielectric constant film is suppressed.

Hereinafter, modifications of the first embodiment will be described.

A modification illustrated in FIGS. 13A and 14D is different from the first embodiment in that polyurea is embedded in the pores 21 of the low dielectric constant film 20 before the process of forming the opening corresponding to the trench in the silicon oxide film 31 by the hard mask 32. That is to say, after the low dielectric constant film 20 is formed, the polyurea is embedded in the pores 21 of the low dielectric constant film 20 by performing a process of vacuum-depositing polyurea with respect to the wafer as described above (FIGS. 13A and 13B). Thereafter, the silicon oxide film 31 is formed on the low dielectric constant film 20 and subsequently, the hard mask 32 is formed on the silicon oxide film 31 (FIG. 13C). Further, the pattern mask for via 33 made of SOC is formed (FIG. 13D).

Subsequently, the silicon oxide film 31 is etched by plasma obtained by plasmarizing a $CH_3F$ gas into plasma, and then the low dielectric constant film 20 is etched by plasma obtained by plasmarizing a $C_6F_6$ gas (FIG. 14A). A recess corresponding to a via 201 formed in this way is embedded with a filling material 34 made of polyurea in the same manner as in the first embodiment (FIG. 14B). Subsequently, by plasma obtained by plasmarizing an oxygen gas, the pattern mask 33 is ashed and polyurea embedded in a hole of the pattern mask 33 is etched and removed (FIG. 14C). Thereafter, the silicon oxide film 31 is etched and removed by plasma obtained by plasmarizing the $CH_3F$ gas. At this time, the polyurea (tip portion of the filling material 34) embedded in a hole of the silicon oxide film 31 is not etched and the tip portion remains protruded from the surface of the low dielectric constant film 20. As in the first embodiment, the low dielectric constant film 20 is etched to form a trench 202 (FIG. 14D). At this time, the filling material 34 is also etched and remains slightly protruded from the bottom of the trench 202. However, as described with reference to FIG. 4B, the protruded portion of the filling material 34 is removed by a slight ashing, whereby the bottom surface of the trench 202 is planarized.

In the first embodiment, when the silicon oxide film 31 on the low dielectric constant film 20 is etched, the surface of the low dielectric constant film 20 is exposed to the etching gas. However, in the method of FIGS. 13A to 14D, since polyurea has already been embedded in the pores 21 of the low dielectric constant film 20 when etching the silicon oxide film 31, there is no concern that damage to the low dielectric constant film 20 by the etching gas occurs.

A modification illustrated in FIGS. 15A to 15D differs from the first embodiment in steps during the transition from the state of FIG. 3D to the state of FIG. 4A of the first embodiment. The state illustrated in FIG. 15A corresponds to the state illustrated in FIG. 3D. In this modification, after the filling material 34 is embedded in the via 201 in the low dielectric constant film 20 from the opening of the pattern mask 33, the wafer is heated to a temperature higher than the depolymerization temperature of polyurea which is the filling material 34, and thus, the polyurea in the opening of the pattern mask 33 is removed (FIG. 15B). Thereafter, SOC which is the same coating film as the pattern mask 33 is formed on the surface of the wafer (FIG. 15C), and subsequently, such an SOC film is removed (FIG. 15D). FIG. 15D corresponds to the state of FIG. 4A.

In this case, in the ashing step of exposing an upper surface of the filling material 34 on the surface of the low dielectric constant film 20, since the film to be removed is only the SOC, it can be expected that there is no possibility of the generation of residual polyurea.

As another modification, a material other than polyurea, for example, SOC, may be embedded as a filling material to be embedded in the via 201. An example of such a method may include a method of forming SOC on the surface of the wafer after the state of FIG. 3D of the first embodiment, and embedding the SOC in the hole illustrated in FIG. 3D. This case corresponds to the state of FIG. 4A of the first embodiment, except for the point that the filling material filled into the via 201 becomes SOC after removing SOC existing above the low dielectric constant film 20. When forming the trench 202 in the low dielectric constant film 20, an oxygen gas is added to a $C_6F_6$ gas to etch the low dielectric constant film 20. Thereafter, the SOC used as the filling material 34 is ashed by plasma obtained by plasmarizing the oxygen gas, thus obtaining the same state as the state of FIG. 4C of the first embodiment.

A modification illustrated in FIGS. 16A to 16D is different from the first embodiment in that the timing of embedding the polyurea in the pores 21 of the low dielectric constant film 20 is the same as the timing of embedding the filling material 34 in the low dielectric constant film 20. The state illustrated in FIG. 16A corresponds to the state in FIG. 2B. After this state, as illustrated in FIG. 16B, a pattern mask 33 made of SOC and having an opening formed to correspond to a via to be formed later is formed on the silicon oxide film 31. Subsequently, the silicon oxide film 31 and the low dielectric constant film 20 are etched to form a via 201. Subsequently, processing of depositing polyurea is performed on the wafer by the vapor deposition polymerization as described in the first embodiment. At this time, the raw material monomer enters the low dielectric constant film 20 through the via 201 so that the polyurea is embedded in the pores 21 of the low dielectric constant film 20. Further, the filling material 34 made of polyurea is embedded in the hole including the via 201 (FIG. 16C). Then, the pattern mask 33 and the polyurea inside the opening of the pattern mask 33 are removed by depolymerization. As a result, the state of FIG. 16D is obtained. Thereafter, the silicon oxide film 31 and the low dielectric constant film 20 are sequentially etched using the hard mask 32, thus obtaining the same state as the state of FIG. 4B.

Second Embodiment

A second embodiment of the present disclosure is a method applied to the trench-first method. FIG. 17A illustrates the state in which a laminated body of a silicon oxide film 31 and a hard mask 32 having an opening formed to correspond to a trench is formed on a low dielectric constant film 20, and polyurea is embedded in pores 21 of the low dielectric constant film 20. The embedding of the polyurea may be performed after the opening is formed in the laminated body or before the silicon oxide film 31 is formed on the low dielectric constant film 20.

Then, the low dielectric constant film 20 is etched using the laminated body as a mask so as to form a trench 202 (FIG. 17B). Subsequently, a polyurea film 41 is formed on the surface of the wafer as described above (FIG. 17C), and an upper layer portion of the polyurea film 41 is depolymerized so as to expose a surface of the hard mask 32 (FIG. 17D). Thereafter, an SOC film 33 (for the sake of convenience in description, the same reference numeral as that of the pattern mask made of SOC is assigned) is formed on the surface of the wafer. Subsequently, a patterning mask composed of an antireflection film for patterning 37 is formed on the SOC film 33 (FIG. 18A).

The patterning mask may be formed by etching the antireflection film 37 with plasma obtained by plasmarizing an oxygen ($O_2$) gas, a carbon dioxide ($CO_2$) gas, an ammonia ($NH_3$) gas, or a mixed gas of a nitrogen ($N_2$) gas and a hydrogen ($H_2$) gas.

Subsequently, the SOC film 33 and the polyurea film 41 are ashed (etched) with plasma obtained by plasmarizing, for example, the oxygen gas, through the use of the above-described patterning mask. Thus, an opening is formed in a portion corresponding to the via 201 (FIG. 18B). At this time, the polyurea film 41 remains formed along an inner peripheral surface of the trench 202.

Subsequently, the low dielectric constant film 20 is etched using plasma obtained by plasmarizing, for example, the $C_6F_6$ gas as an etching gas as described above, thus forming the via 201 (FIG. 18C). Subsequently, the pattern mask 33 is ashed and removed by plasma obtained by plasmarizing the oxygen gas, and the polyurea film 41 formed along the inner peripheral surface of the trench 202 is removed by depolymerization (FIG. 18D).

As described above, the polyurea film 41 is depolymerized by heating the wafer to a temperature equal to or higher than the temperature at which polyurea is depolymerized and adjusting the heating temperature and the heating time. At this time, in the low dielectric constant film 20, the polyurea escapes from the pores 21 in a portion near the inner peripheral surface of the via 201. Subsequent steps are performed in the same manner as in the first embodiment.

According to the second embodiment, as in the first embodiment, a raw material for polymerization is supplied to the low dielectric constant film 20, polyurea is embedded in the pores 21 of the low dielectric constant film 20, the low dielectric constant film 20 is etched, and subsequently, the wafer is heated so as to depolymerize the polyurea. Therefore, when etching the low dielectric constant film 20, the low dielectric constant film 20 is protected by polymer. That is to say, even with the second embodiment, the same effects as in the first embodiment can be obtained. After forming the trench 202, a mask for forming the via 201 inside the trench 202 is formed by the polyurea film 41. Thus, the removal of the mask from the inside of the trench 202 may be performed by depolymerization of the polyurea film 41 using heating. Therefore, it is possible to suppress damage to the inner wall of the trench 202.

Modifications of the second embodiment will be described below.

Figure 20A:
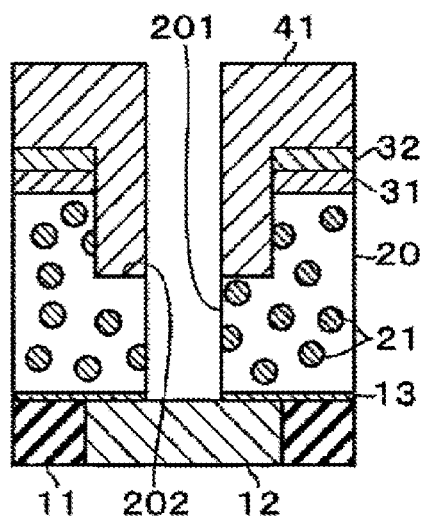
FIGS. 20A and 20B are explanatory views illustrating some steps of the manufacturing process according to the modification of the second embodiment.

FIG. 19A illustrates a state which is the same as that in FIG. 17B. In this state, a polyurea film 41 is formed on the surface of the wafer (FIG. 19B). Subsequently, an opening is formed in a portion corresponding to a via 201 to be formed in the polyurea film 41 using a pattern mask made of, for example, SOC (FIG. 19C). Subsequently, the via 201 is formed in the low dielectric constant film 20 using the polyurea film 41 as a mask (FIG. 19D). Thereafter, the etching stopper film 13 on the bottom of the via 201 is etched as described above (FIG. 20A).

Figure 20B:
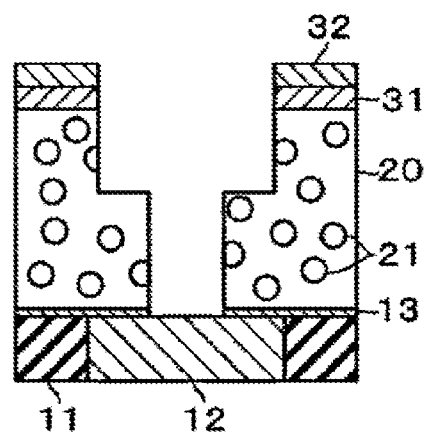

Thereafter, the wafer is heated to remove the polyurea film 41 by depolymerization, and the heating is continued to remove the polyurea embedded in the pores 21 of the low dielectric constant film 20 by depolymerization (FIG. 20B). Then, as illustrated in FIGS. 5A and 5B of the first embodiment, the barrier layer 35 and the copper wire 36 are formed.

Further, in this modification, the mask for etching the via 201 is formed by the polyurea film 41, but may be formed by an SOG film instead of the polyurea film 41. In this case, the polyurea film 41 described with reference to FIGS. 19B to 20A is substituted for the SOC film. In the case of using the SOC film as a mask, the SOC film is ashed with plasma obtained by plasmarizing an oxygen gas. Since the polyurea is embedded in the pores 21 of the low dielectric constant film 20, damage caused by plasma is suppressed during the ashing process.

A modification illustrated in FIGS. 21A to 22D will be described. In this modification, polyurea is embedded in the pores 21 of the low dielectric constant film 20 (FIGS. 21A and 21B). Subsequently, a silicon oxide film 31 is formed on the low dielectric constant film 20 (FIG. 21C). Further, a hard mask 32 made of TiN and having an opening corresponding to a trench to be formed is formed on the silicon oxide film 31. Thereafter, an opening corresponding to the trench is also formed in the silicon oxide film 31 serving as a protective film. Thereafter, the low dielectric constant film 20 is etched using a laminated body of the hard mask 32 and the silicon oxide film 31 as a mask to form a trench 202 (FIG. 21D).

Subsequently, a polyurea film 41 is formed on the wafer so as to embed the polyurea film 41 in the trench 202 (FIG. 22A). Thereafter, an SOC film is laminated on the polyurea film 41. The polyurea film 41 is etched using a pattern mask 33 in which an opening corresponding to a via 201 to be formed is formed in the SOC film (FIG. 22B). The opening is formed by being patterned with a resist.

Subsequently, the low dielectric constant film 20 is etched using the polyurea film 41 and the pattern mask 33 so as to form the via 201 (FIG. 22C). Thereafter, the pattern mask 33 is removed by ashing as described above, and the polyurea film 41 is removed by depolymerization (FIG. 22D). Thereafter, for example, the same processes as in the first embodiment are performed.

In the modification illustrated in FIGS. 21A to 22D, the embedding of polyurea in the pores 21 of the low dielectric constant film 20 may be performed in the state in which the laminated body of the silicon oxide film 31 and the hard mask 32, which has an opening corresponding to the trench 202, is stacked on the low dielectric constant film 20. The low dielectric constant film 20 is etched using the laminated body as a mask so as to form the trench 202. Subsequently, the embedding of polyurea in the pores 21 of the low dielectric constant film 20 may be performed simultaneously with the embedding of the polyurea film 41 in the trench 202. In order to simultaneously perform the embedding of the polyurea film 41 in the trench 202 and the embedding of polyurea in the pores 21, as is apparent from Evaluation tests described later, the vacuum vapor deposition for the raw material monomer may be carried out, for example, in two steps. In this case, a first step may be a method of alternately supplying an isocyanate vapor and an amine vapor while performing a nitrogen gas-based purging process between the supply of the isocyanate vapor and the supply of the amine vapor as described in the first embodiment. The second step may be a method of simultaneously supplying the isocyanate vapor and the amine vapor.

Figure 23A:
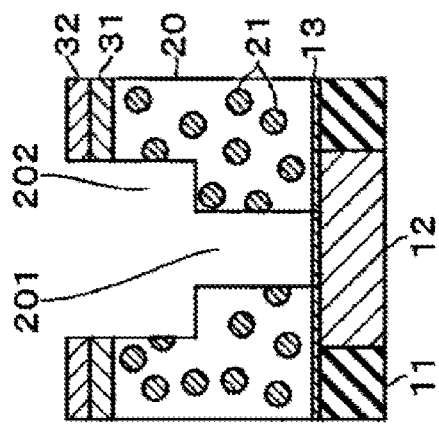
FIGS. 23A to 23C are explanatory views illustrating some steps of the manufacturing process according to the modification of the second embodiment.
Figure 23B:
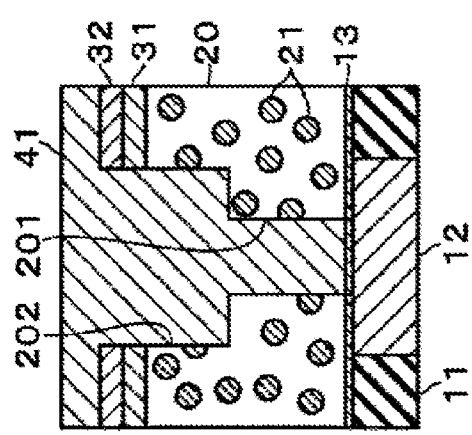
Figure 23C:
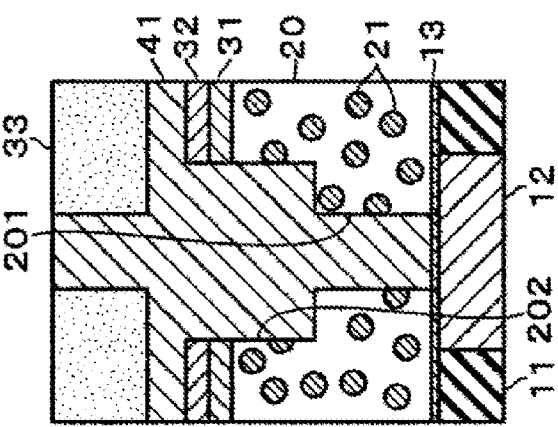

In a modification illustrated in FIGS. 23A to 23C, from the state illustrated in FIG. 22C described above (the state in which the via 201 is formed), polyurea is embedded in a recess formed in a pattern mask (SOC) 33 and a polyurea film 41 (FIG. 23A). Thereafter, the polyurea embedded in the pattern mask 33 and the pattern mask 33 are removed by etching (FIG. 23B). Subsequently, the polyurea film 41 is removed by depolymerization. In this modification, since an inner wall of the via 201 is covered with the polyurea film 41 when ashing the pattern mask 33, it is possible to suppress damage to the low dielectric constant film 20 (FIG. 23C).

Example

[Evaluation Experiment 1]

A film-forming process was performed which includes alternately supplying H6XDI as isocyanate and H6XDA as amine in a gaseous state to a substrate having a porous low dielectric constant film made of SiOC for 3 seconds each time, and performing a nitrogen gas-based purging process for 12 seconds after one of the supply of H6XDI and the supply of H6XDA is terminated and before the other is initiated. This procedure was performed 100 cycles. Composition in the surface of the substrate before and after the film-forming process was examined by X-ray Photoelectron Spectroscopy (XPS). The results are shown in FIGS. 24 and 25.

Figure 24:
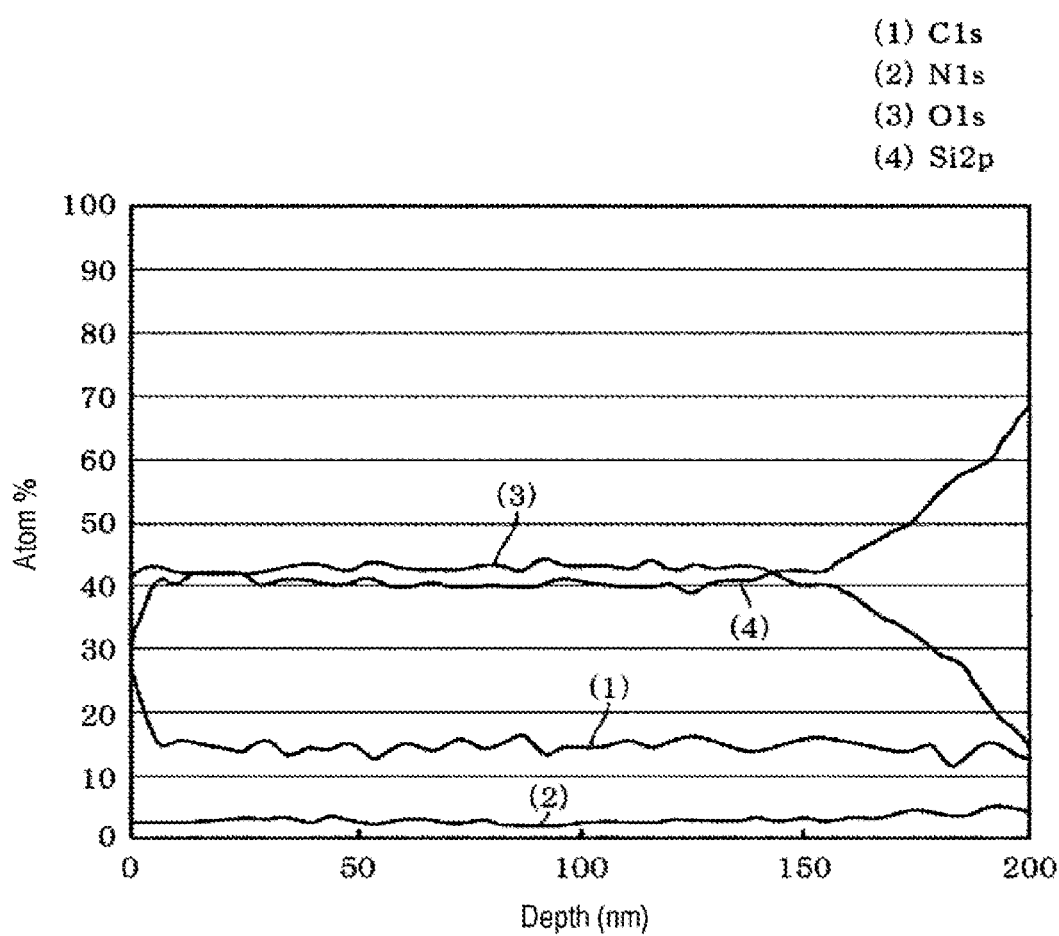
FIG. 24 is a graph representing a composition obtained by XPS for a surface portion of a low dielectric constant film before the embedding of polyurea.
Figure 25:
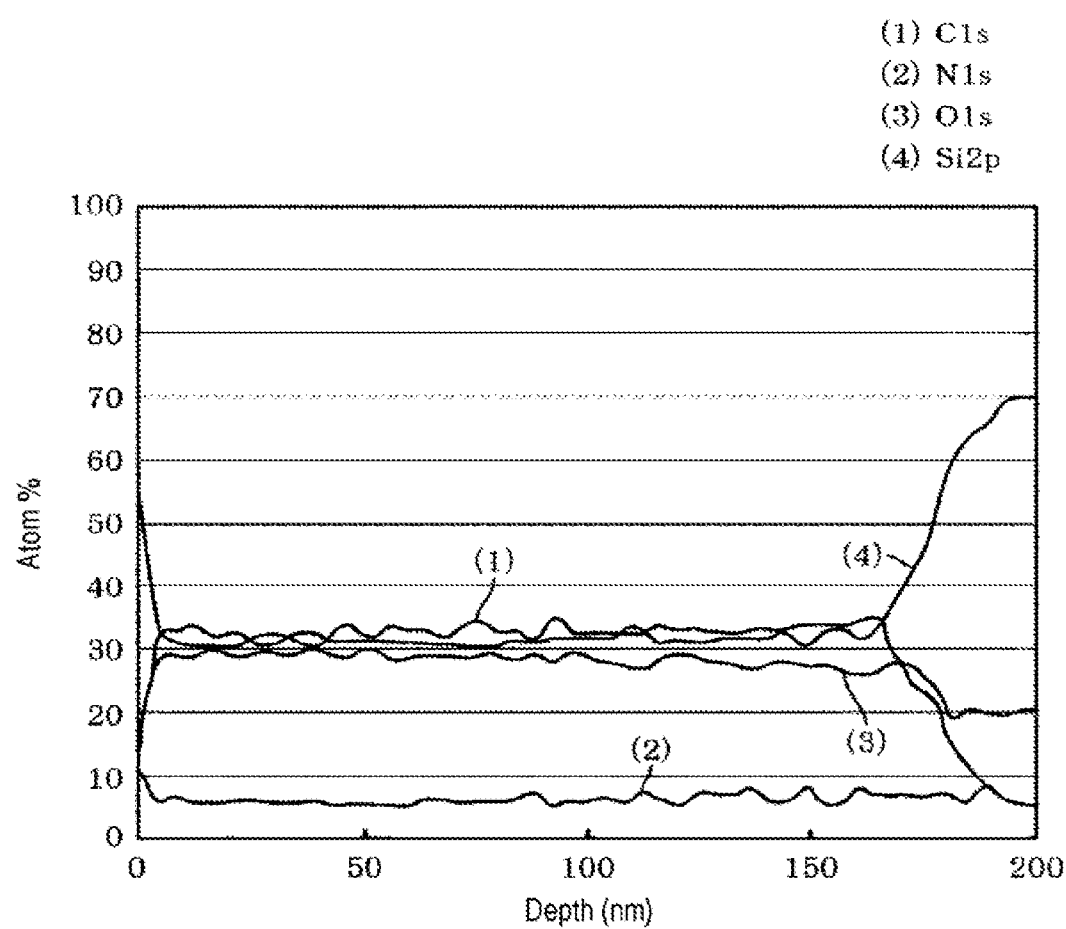
FIG. 25 is a graph representing a composition obtained by XPS for the surface portion of the low dielectric constant film after the embedding of polyurea.

As can be seen from FIG. 24 (before the film-forming process) and FIG. 25 (after the film-forming process), carbon (C) in the low dielectric constant film is greatly increased and nitrogen (N) is also increased by performing the film-forming process. Therefore, it can be seen that polyurea is embedded in the pores of the low dielectric constant film by carrying out the film-forming process.

[Evaluation Experiment 2]

A film-forming process was performed which includes alternately supplying H6XDI and H6XDA in a gaseous state to a substrate having a porous low dielectric constant film made of SiOC for 3 seconds each time, and after the completion of one of the supply of H6XDI and the supply of H6XDA, immediately performing the supply of the other while bypassing a purging process. This procedure was performed 100 cycles. Composition in the surface of the substrate after the film-forming process was examined by XPS. The results are shown in FIG. 26.

Figure 26:
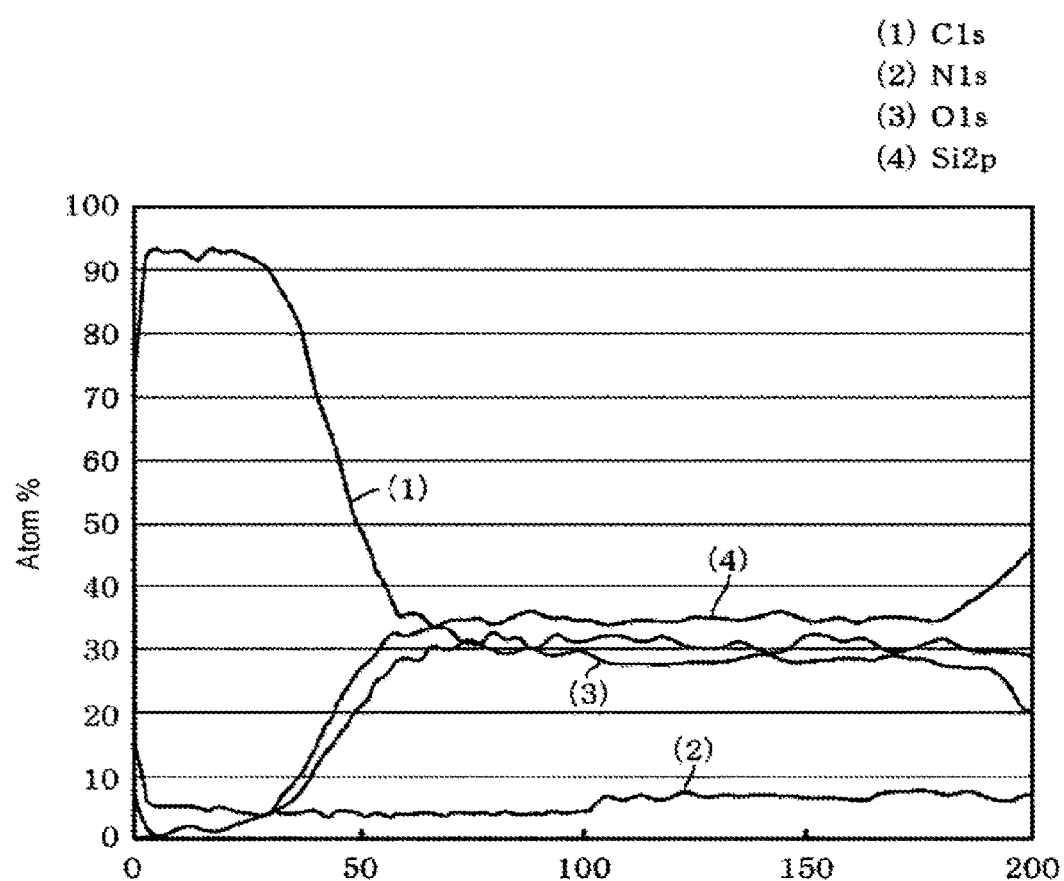
FIG. 26 is a graph representing a composition obtained by XPS on the surface portion of the low dielectric constant film after the embedding of polyurea.

As can be seen from FIG. 26, a polyurea film is formed to reach a depth of about 50 nm from the surface of the substrate, and is formed similarly to FIG. 25 in a deeper region. From this, it can be recognized that polyurea is embedded in the pores of the low dielectric constant film, while the polyurea film is laminated on the surface of the low dielectric constant film.

[Evaluation Experiment 3]

Figure 27:
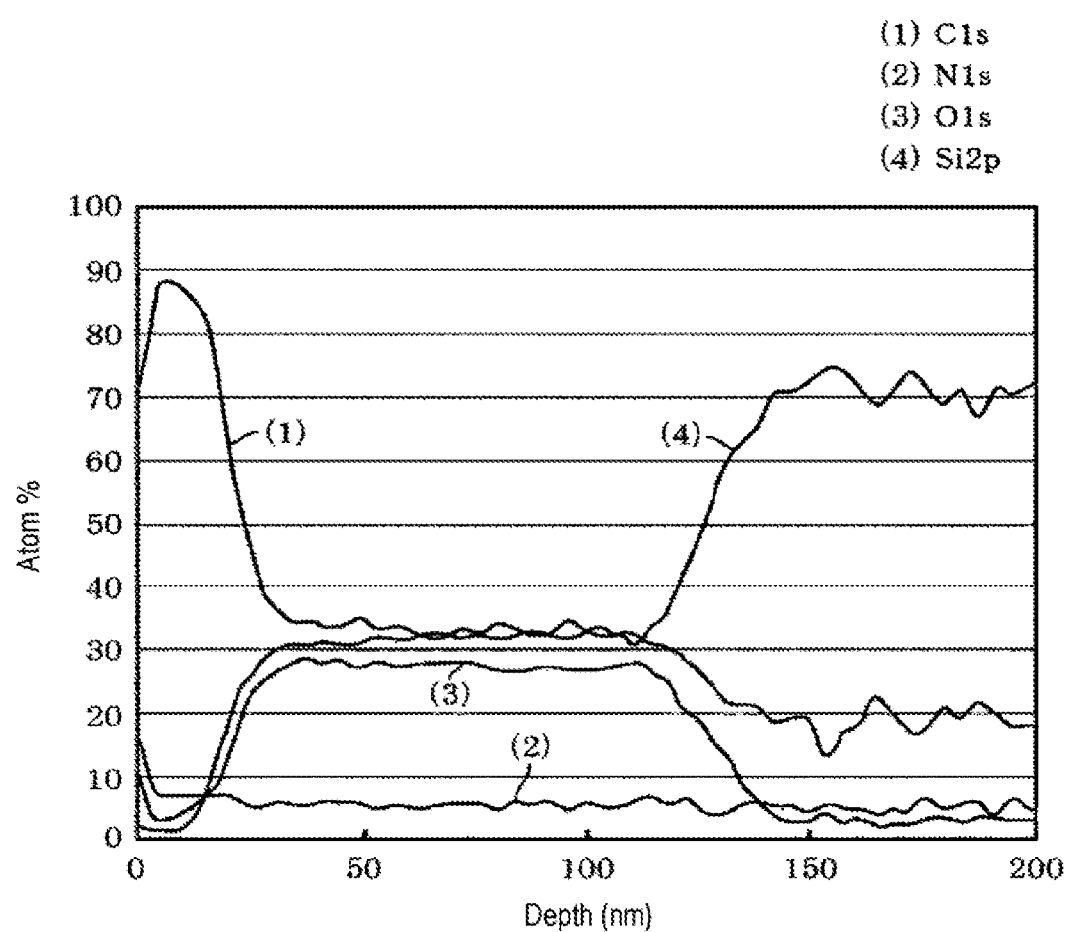
FIG. 27 is a graph representing a composition obtained by XPS on the surface portion of the low dielectric constant film after the embedding of polyurea.

A film-forming process was performed which includes simultaneously supplying H6XDI and H6XDA to a substrate having a porous low dielectric constant film made of SiOC. Composition in the surface of the substrate after the film-forming process was examined by XPS. The results are shown in FIG. 27. As can be seen from FIG. 27, a polyurea film is formed to reach a depth of about 25 nm from the surface of the substrate, and is formed similarly to FIG. 25 in a deeper region. From this, it can be recognized that polyurea is embedded in the pores of the low dielectric constant film, while the polyurea film thinner than that in Evaluation Experiment 2 is laminated on the surface of the low dielectric constant film.

[Evaluation Experiment 4]

Figure 28:
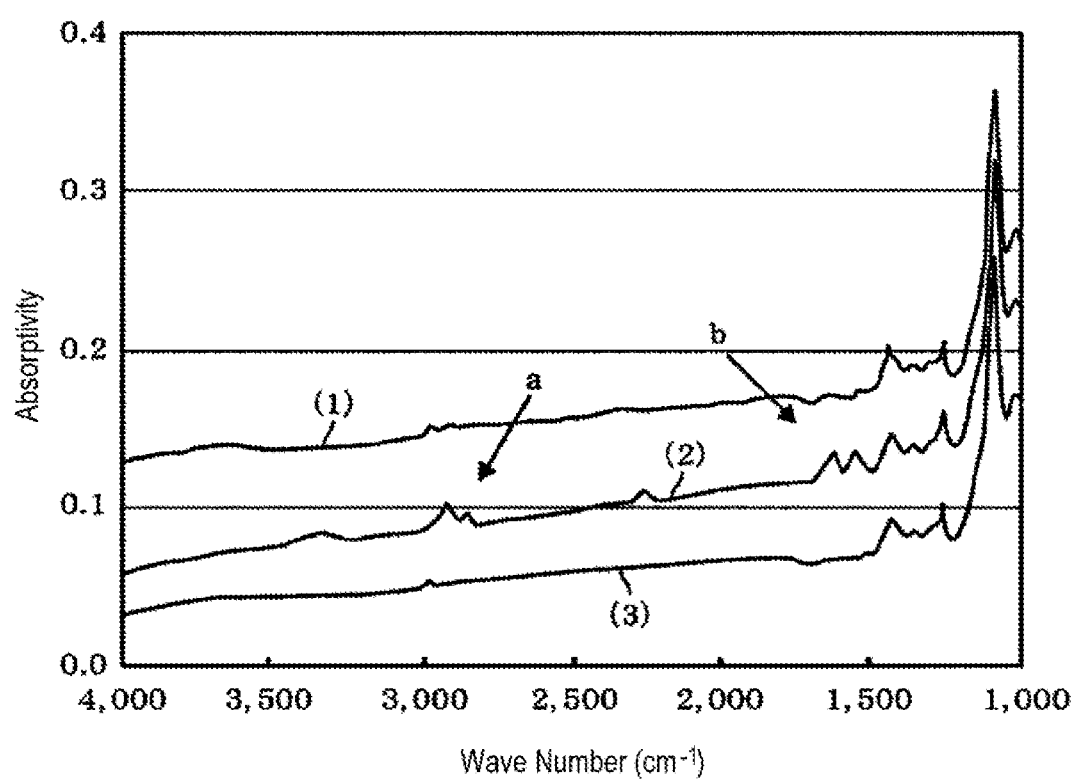
FIG. 28 is a characteristic diagram representing absorptivity available before and after the embedding of polyurea and after heat treatment in a low dielectric constant film.

In the above Evaluation Experiment 1, the substrate after the film-forming process was heated at 280 degrees C. for 5 minutes in a nitrogen gas atmosphere. The results of examining the absorptivity of a substrate before and after the film-forming process are shown in FIG. 28. In FIG. 28, (1) to (3) correspond to before embedding, after embedding, and after heating, respectively. In after embedding (2), peaks corresponding to a CH bond (indicated by an arrow a) and a CO bond (indicated by an arrow b) are observed, but such peaks are not observed before embedding (1) and the after heating (3).

Therefore, it is ensured that polyurea is not left in the low dielectric constant film at all by embedding polyurea in the pores of the low dielectric constant film by the above-described film-forming process, and by performing the removal process of the polyurea.

From the above results, it can be seen that, depending on a method of supplying raw material gases, it is possible to perform only the embedding of polyurea in pores of a low dielectric constant film, or form a polyurea film in addition to the embedding of the pores.

According to the present disclosure in some embodiments, a raw material for polymerization is supplied to a low dielectric constant film so as to embed a polymer (polyurea) having a urea bond in pores of the low dielectric constant film. After the low dielectric constant film is etched, the substrate is heated so as to depolymerize the polymer. Therefore, when etching the low dielectric constant film, the low electric constant film is protected by the polymer. After forming a via and before forming a trench, a filling material made of an organic substance is embedded in the via. Accordingly, since the low dielectric constant film is protected against active species during etching, occurrence of damage is suppressed.

Further, according to the present disclosure, a raw material for polymerization is supplied to a low dielectric constant film so as to embed a polymer (polyurea) having a urea bond in pores of a low dielectric constant film. After the low dielectric constant film is etched, the substrate is heated so as to depolymerize the polymer. Therefore, when etching the low dielectric constant film, the low electric constant film is protected by the polymer. A via is formed after a trench is formed. After forming the via, a mask formed inside the trench, which is used to form the via, is removed. At this time, since polyurea has been embedded in the low dielectric constant film, damage caused by plasma for removing the mask is suppressed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device manufacturing method of forming a trench and a via in a porous low dielectric constant film formed on a substrate as an interlayer insulating film, the method comprising:
    embedding a polymer having a urea bond in pores of the porous low dielectric constant film by supplying a raw material for polymerization to the porous low dielectric constant film;
    forming the via by etching the porous low dielectric constant film;
    subsequently, embedding a protective filling material made of an organic substance in the via;
    subsequently, forming the trench by etching the porous low dielectric constant film;
    subsequently, removing the protective filling material; and
    after the forming a trench, removing the polymer from the pores of the porous low dielectric constant film by heating the substrate to depolymerize the polymer,
    wherein the embedding a polymer having a urea bond in pores is performed before the forming a trench.

2. The method of claim 1, wherein the protective filling material is a polymer having a urea bond.

3. The method of claim 1, further comprising:
    forming a trench mask for etching the trench formed on a surface of the porous low dielectric constant film; and
    subsequently, forming a via mask for etching the via,
    wherein the embedding a polymer having a urea bond in pores is performed after the forming a trench mask and before the forming a via.

4. The method of claim 1, further comprising:
    forming a trench mask for etching the trench formed on a surface of the porous low dielectric constant film; and
    subsequently, forming a via mask for etching the via,
    wherein the embedding a polymer having a urea bond in pores is performed before the forming a trench mask.

5. The method of claim 1, wherein the embedding a polymer having a urea bond in pores is performed simultaneously with the embedding a protective filling material.

6. The method of claim 1, further comprising:
    after the removing the protective filling material, etching an etching stopper film located on a bottom of the via,
    wherein the removing the polymer from the pores of the porous low dielectric constant film is performed after the etching an etching stopper film.

7. The method of claim 1, wherein the embedding a polymer includes diffusing a vapor of an isocyanate and a vapor of an amine into the porous low dielectric constant film, and reacting the isocyanate and the amine with each other by copolymerization.

8. The method of claim 1, wherein the depolymerizing the polymer is performed by heating the substrate at a temperature of 300 degrees C. to 400 degrees C.

* * * * *